United States Patent
Polito et al.

(10) Patent No.: US 8,633,052 B2
(45) Date of Patent: Jan. 21, 2014

(54) WEDGE IMPRINT PATTERNING OF IRREGULAR SURFACE

(75) Inventors: Benjamin F. Polito, Cambridge, MA (US); Holly G. Gates, Somerville, MA (US); Emanuel M. Sachs, Newton, MA (US)

(73) Assignees: 1366 Technologies Inc., Bedford, MA (US); Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/937,810

(22) PCT Filed: Apr. 17, 2009

(86) PCT No.: PCT/US2009/002423
§ 371 (c)(1),
(2), (4) Date: Feb. 11, 2011

(87) PCT Pub. No.: WO2009/128946
PCT Pub. Date: Oct. 22, 2009

(65) Prior Publication Data
US 2011/0129956 A1       Jun. 2, 2011

Related U.S. Application Data

(60) Provisional application No. 61/124,608, filed on Apr. 18, 2008, provisional application No. 61/201,595, filed on Dec. 12, 2008.

(51) Int. Cl.
*H01L 21/00*         (2006.01)
(52) U.S. Cl.
USPC .......................................................... 438/71
(58) Field of Classification Search
USPC ........................................ 438/71; 257/E31.13
See application file for complete search history.

(56) References Cited

U.S. PATENT DOCUMENTS

| | | | |
|---|---|---|---|
| 6,334,960 B1 | 1/2002 | Willson et al. | |
| 6,957,608 B1 * | 10/2005 | Hubert et al. | 101/483 |
| 2001/0013294 A1 * | 8/2001 | Bruno et al. | 101/327 |
| 2003/0040245 A1 | 2/2003 | Song et al. | |
| 2004/0159633 A1 * | 8/2004 | Whitesides et al. | 216/54 |
| 2005/0153074 A1 * | 7/2005 | Wessels et al. | 427/256 |

(Continued)

OTHER PUBLICATIONS

International Search Report and Written Opinion, prepared by the International Searching Authority, dated Jul. 17, 2009 for PCT/US 09/02423, to which the present application claims priority.

(Continued)

*Primary Examiner* — Kevin Parendo
(74) *Attorney, Agent, or Firm* — Steven J. Weissburg

(57) ABSTRACT

Patterned substrates for photovoltaic and other uses are made by pressing a flexible stamp upon a thin layer of resist material, which covers a substrate, such as a wafer. The resist changes phase or becomes flowable, flowing away from locations of impression, revealing the substrate, which is subjected to some shaping process, typically etching. Portions exposed by the stamp being are removed, and portions that protected by the resist, remain. A typical substrate is silicon, and a typical resist is a wax. Workpiece textures include extended grooves, discrete, spaced apart pits, and combinations and intermediates thereof. Platen or rotary patterning apparatus may be used. Rough and irregular workpiece substrates may be accommodated by extended stamp elements. Resist may be applied first to the workpiece, the stamp, or substantially simultaneously, in discrete locations, or over the entire surface of either. The resist dewets the substrate completely where desired.

21 Claims, 29 Drawing Sheets

(56) References Cited

U.S. PATENT DOCUMENTS

| | | |
|---|---|---|
| 2005/0189012 A1* | 9/2005 | Kondo et al. .................. 136/256 |
| 2006/0286785 A1 | 12/2006 | Rogers |
| 2007/0205525 A1 | 9/2007 | Engl |
| 2007/0212522 A1* | 9/2007 | Heidari et al. ................. 428/141 |
| 2007/0235410 A1* | 10/2007 | Wong et al. ..................... 216/41 |
| 2007/0281471 A1 | 12/2007 | Hurwitz |
| 2008/0135866 A1* | 6/2008 | Donofrio ........................ 257/98 |

OTHER PUBLICATIONS

EP Supplemental Search Report, dated Jun. 8, 2011 for EPO Application No. 09733653.1, also claiming priority to PCT/US 09/02423.

* cited by examiner

WEDGE IMPRINT PATTERNING OF IRREGULAR SURFACE

BACKGROUND

Certain processing schemes and architecture are disclosed in Patent Cooperation Treaty Application No. PCT/US2008/002058, entitled, SOLAR CELL WITH TEXTURED SURFACES, filed Feb. 15, 2008, in the names of Emanuel M. Sachs and James F. Bredt and The Massachusetts Institute of Technology, designating the United States of America, and also claiming priority to two provisional U.S. application No. 60/901,511, filed Feb. 15, 2007, and U.S. No. 61/011,933, filed Jan. 23, 2007. All of the PCT application and the two US provisional applications are hereby incorporated fully herein by reference. The technology disclosed in these applications is referred to herein collectively as Self Aligned Cell (SAC) technology.

Provisional U.S. Patent application Ser. No. 61/201,595, entitled WEDGE IMPRINT PATTERNING OF IRREGULAR SURFACE, filed on Dec. 12, 2008, relates to matters disclosed herein and priority is hereby claimed to and the benefit of this provisional application No. 61/201,595 is hereby claimed and it is hereby fully incorporated herein by reference.

Provisional U.S. Patent application Ser. No. 61/124,608, entitled PRINTING ASPECTS OF SELF ALIGNED CELL ARCHITECTURE, filed on Apr. 18, 2008, relates to matters disclosed herein and priority is hereby claimed to and the benefit of this provisional application No. 61/124,608 is hereby claimed and it is hereby fully incorporated herein by reference.

It is desirable to have efficient methods for patterning of silicon wafers with point and line features to define regions to be etched, allowing the formation of light-trapping texture and other topographic features for use in photovoltaic (PV) cells. Modern silicon solar cells are on the order of 200 μm thick, so it is desirable that the size of the etched features be on the order of 20 μm or smaller, to limit the quantity of valuable silicon lost to etching and associated mechanical weakness of the wafer. Economical sawn silicon wafer stock has significant surface roughness, so it is further desirable that the patterning methods be compatible with rough surfaces.

The highest efficiency laboratory PV cells make routine use of patterning by photolithography to precisely define texture and metallization regions, but these methods are generally not used in industrial production of cells due to cost and rate issues. Limited manufacturing use of photolithography may be feasible in some cases but even in best case scenarios costs will be high, primarily due to the specialized nature of the photochemicals required, the many process steps involved, and the associated yield losses. Subsidiary challenges include reducing the extreme waste of resist material inherent in film forming by spin coating, focusing an exposure on multicrystalline substrates with variable thickness, and the high capital cost of projection lithography equipment.

Non-photolithographic patterning methods that are known include soft lithographic techniques and nanoimprint lithography. Soft lithography involves use of an elastomeric stamp with raised planar (flat-topped) features to define a pattern at the micro or nanoscale. The earliest soft lithographic techniques involve deposition of fragile self-assembled monolayers which are limited in their ability to withstand strong etch chemistries. Subsequent soft lithographic techniques involve thermal or photocuring of specialized polymers within channels in a stamp, which limits the general applicability of the technique and has similar materials cost issues as photolithography. Soft lithographic techniques are not presently in industrial use at manufacturing scale.

Nanoimprint lithography is another non-photolithographic patterning technique that involves deformation of a polymeric film by means of a tool with raised planar features that are stiff relative to the polymeric film. It is targeted at ultrafine features of ~20 nm size for VLSI applications, where optical diffraction effects render photolithography problematic. The use of hard tools limits the technique to conventional polished substrates, and generally a thin residue layer is present on the surface of the substrate in the imprinted regions following imprint, which must be removed by dry etching under vacuum in a subsequent step. One electronics manufacturing company has qualified nanoimprint lithography for use in making high performance nanometer-scale microchips, but cost and rate limitations likely preclude its use on large, lower value substrates such as solar cells. Also, the forces involved (on the order of 1900 psi) would likely crack fragile irregular multicrystalline silicon wafers. Nanoimprint lithography does not appear to be in widespread industrial use and has not seen significant development in other industries.

A variety of printing techniques are known for producing patterns of polymer inks, including screen printing, gravure printing, offset printing, and flexographic printing, and these techniques are amply fast for solar cell processing, but these techniques are generally limited to feature sizes on the order of 75-100 um or larger, too large for patterning texture. Dynamic squeeze-out of ink during printing, also known as "dot gain" limits the quality of these processes at the lower limit of size.

The known techniques described above have limitations that render them inappropriate for industrial patterning of surface texture on standard silicon solar cells. It is therefore desirable to have a low-cost process capable of micron-scale patterning of the irregular surfaces of the multicrystalline wafer stock that is typical in the PV industry. It is further desirable that such a method make efficient use of inexpensive resist materials, that it require relatively few processing steps, and that it be suitable for high speed continuous processing at rates on the order of one wafer per second.

PARTIAL SUMMARY

Innovations disclosed herein include methods. Patterned substrates with a specified texture for photovoltaic and other uses are made. The substrates are made by impressing a flexible stamp upon a thin layer of resist material, which covers a substrate wafer. The resist becomes flowable upon heating and flows away from the locations of impression under conditions of heat and pressure, revealing regions of the substrate wafer to the stamp. The wafer is then cooled with the stamp in place, the stamp is removed, and the wafer is further subjected to some shaping process, typically an etching process, with portions of the substrate exposed by action of the stamp being removed, and portions of the substrate that are protected by the resist, remaining. A typical substrate is silicon, and a typical resist is a wax. The stamp may be used over and over again. The stamp is typically made by casting a flexible material into a master mold. The master mold can be reused also. The master mold may be made by providing a substrate, which also may typically be of a silicon, patterning with conventional photolithography, and anisotropic etching.

Thus, in order of use, a master mold is prepared by masking, patterning, and shaping. The mold is used to make a flexible stamp. The stamp is used to pattern a resist layer on a workpiece, which is then subjected to a different shaping step, to shape the workpiece. The workpiece may then be used for photovoltaic, or other uses. Textures that can be provided to the workpiece include extended grooves, discrete, spaced apart pits, and combinations thereof, as well as intermediates thereof. Platen or rotary based techniques may be used for patterning the workpiece. Rough and irregular workpiece substrates may be accommodated by using extended stamp elements to insure that the shaped portion of the stamp contacts the surface of the workpiece. The stamp may be brought to bear upon the workpiece by any suitable means, such as translating a platen, or preferably by mounting the stamp on a flexible membrane that translates under the influence of a pressure differential across it. Methods described here are termed "wedge imprinting". At least two alternative methods are also described. The flowable material may also be provided on the stamp, in a nip between the stamp and the substrate, or only in certain regions of the stamp.

DETAILED DESCRIPTION

Figure 11:
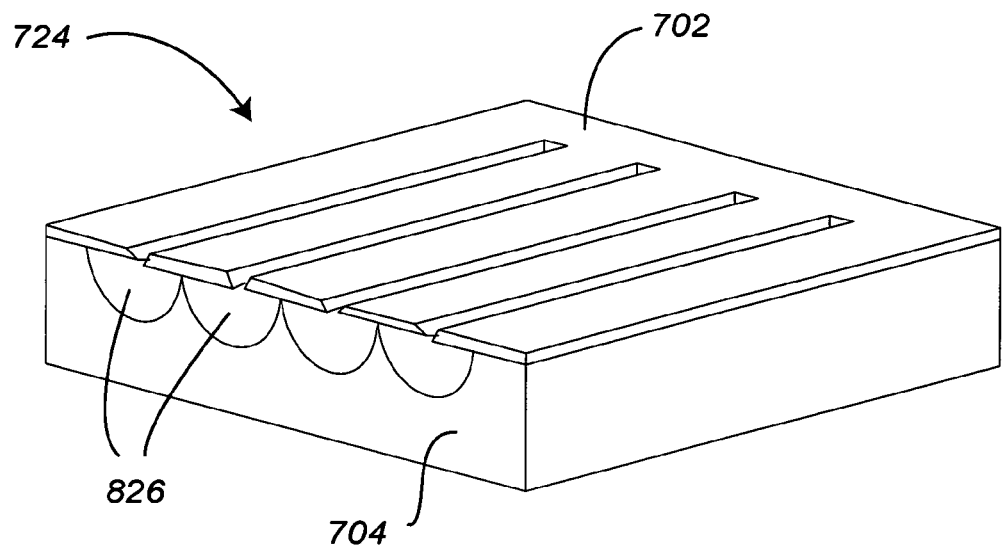
FIG. 11 is a schematic representation of the substrate shown in FIG. 10, after etchant has been provided and contacted the substrate through the patterns in the resist layer, shown in FIG. 10, with portions of the substrate having been etched away to form linear channels having a roughly semi-circular cross-section.
Figure 12:
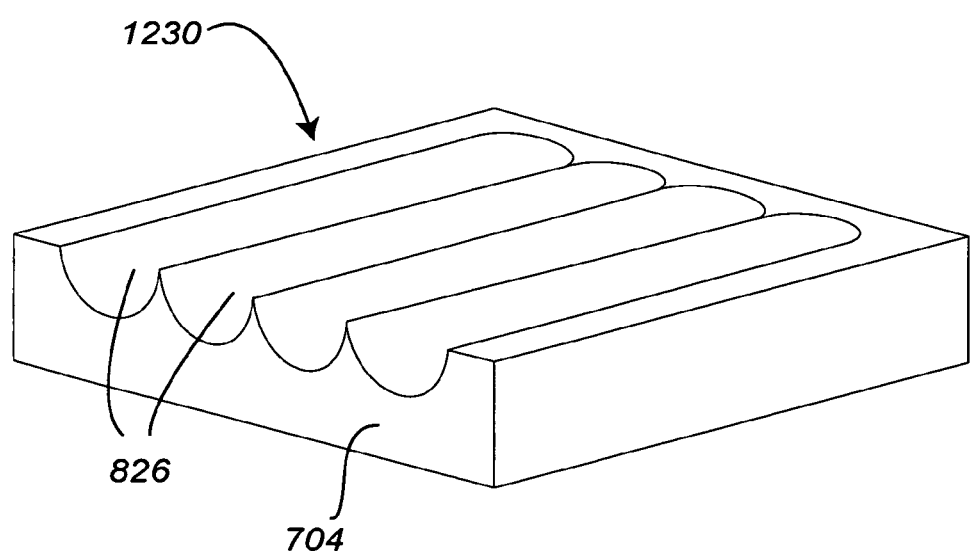
FIG. 12 is a schematic representation of the etched substrate shown in FIG. 11, after the resist layer, has been removed, to reveal the channels.
Figure 13:
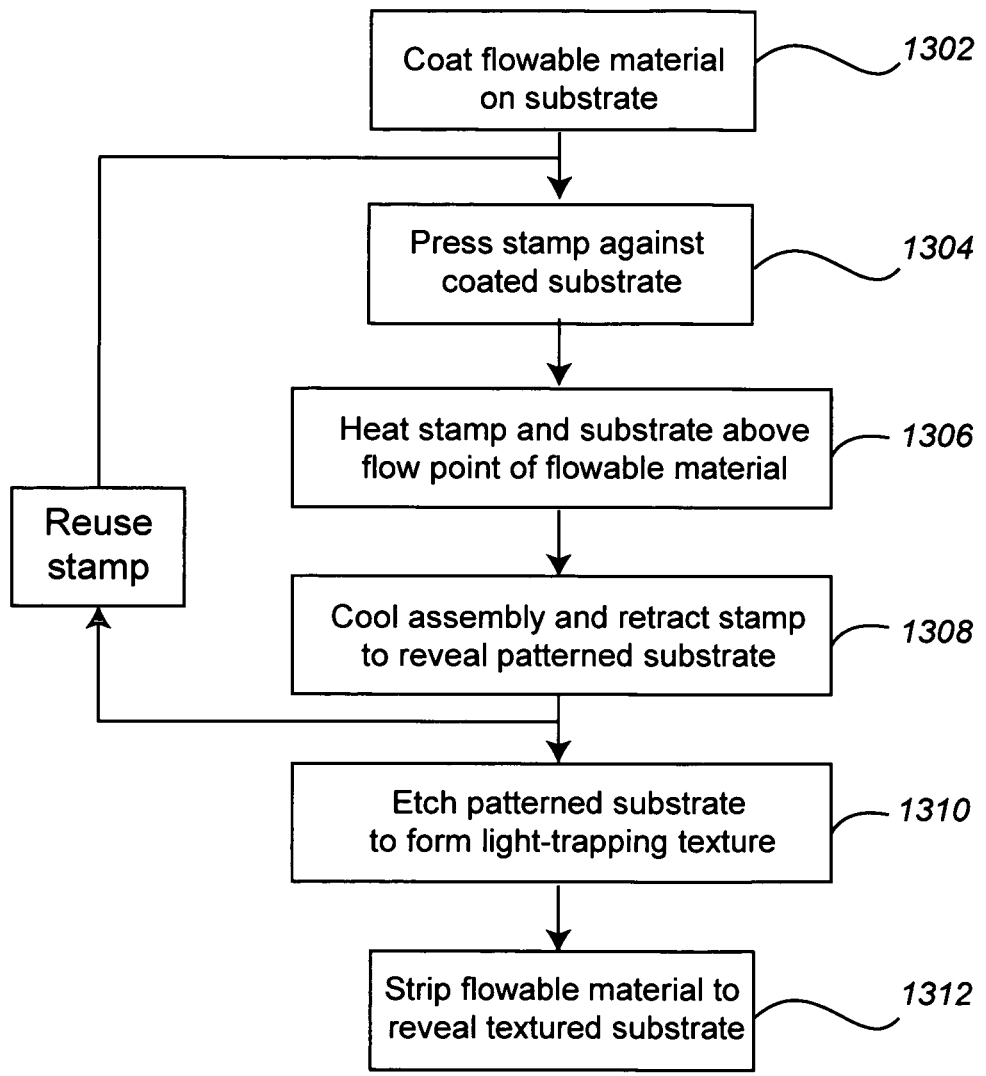
FIG. 13 is a schematic representation in flow-chart form of several typical process steps for forming a textured pattern upon a substrate, using a stamp and a mask material that flows upon heating.
Figure 14:
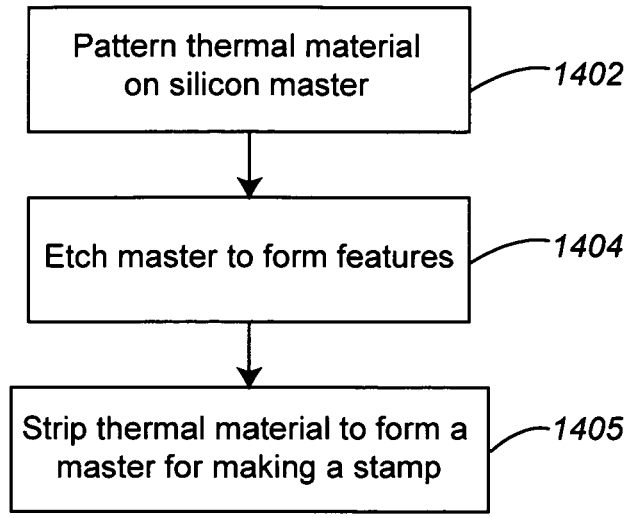
FIG. 14 is a schematic representation in flow-chart form of several typical process steps for forming a master mold, that will be used to form a stamp that will be used in a process such as shown in FIG. 13.
Figure 15:
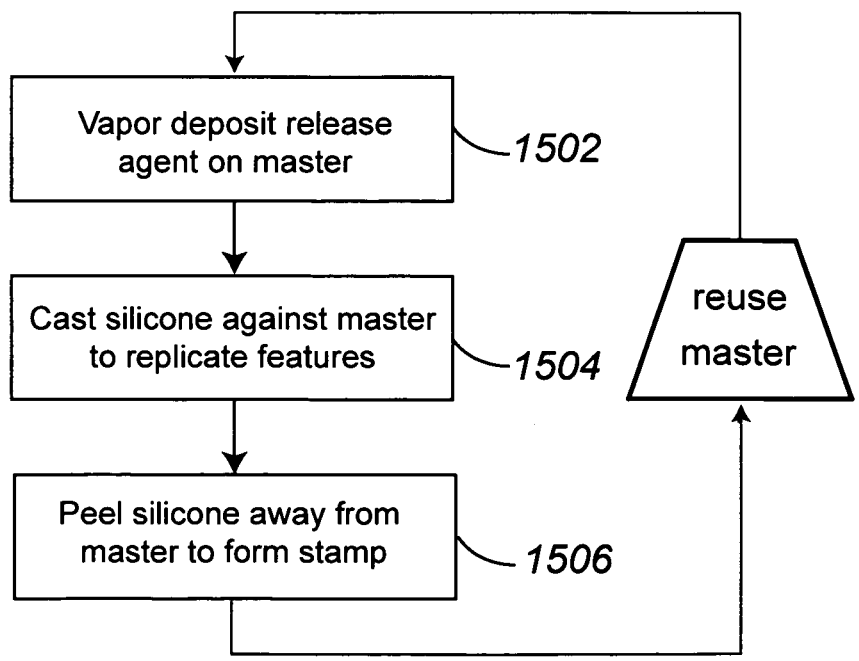
FIG. 15 is a schematic representation in flow-chart form of several typical process steps for forming a stamp that will be used in a process such as shown in FIG. 13.

FIGS. 1-12 show tools used and work pieces being formed at different stages of a typical process. A beneficial process sequence is shown schematically in flow chart form in FIGS. 13, 14, and 15. FIG. 13 relates to making a silicon master mold. FIG. 14 relates to making a flexible stamp using the master mold. FIG. 15 depicts use of the stamp to pattern a substrate.

Figure 1:
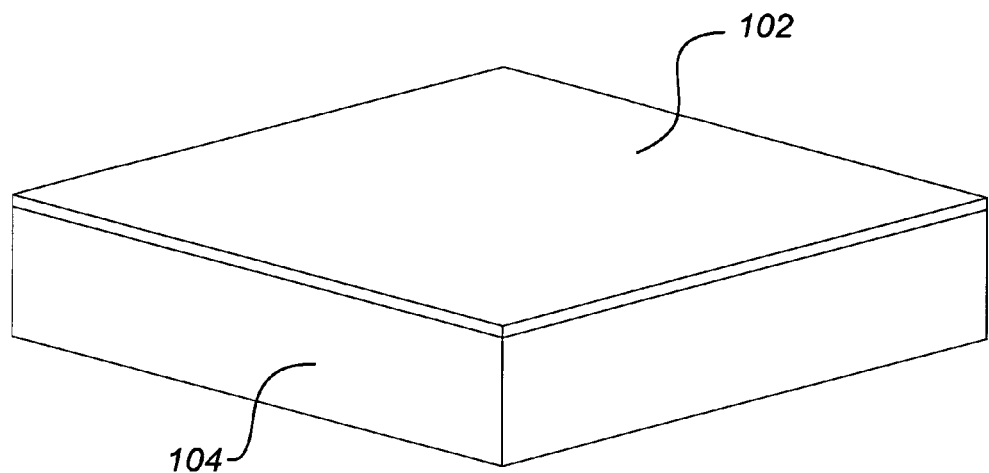
FIG. 1 is a schematic representation in perspective view of a silicon body that will be used to form a master mold, covered with a resist layer.
Figure 2:
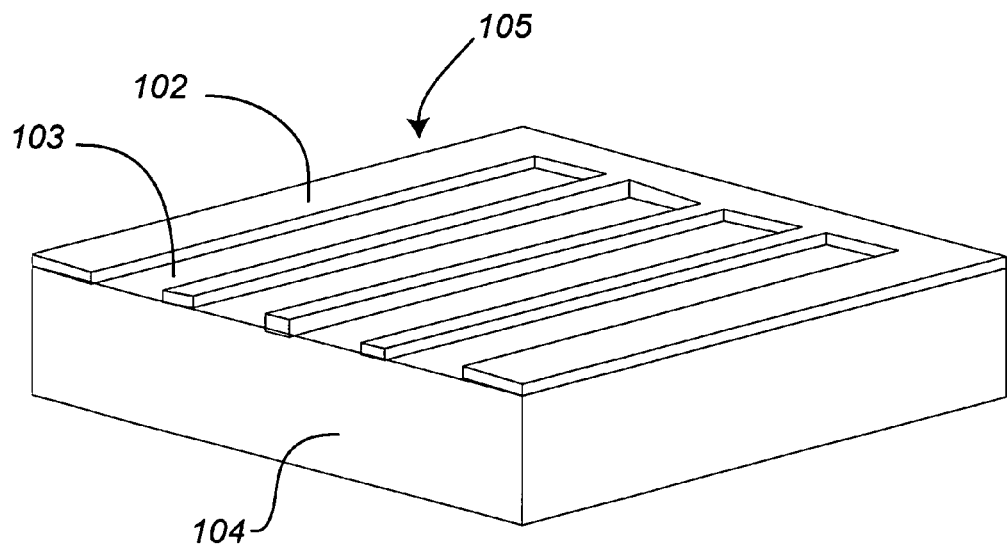
FIG. 2 is a schematic representation of the silicon body of FIG. 1, with a portion of the resist layer removed to form a mask having linear openings that are generally rectangular.
Figure 3:
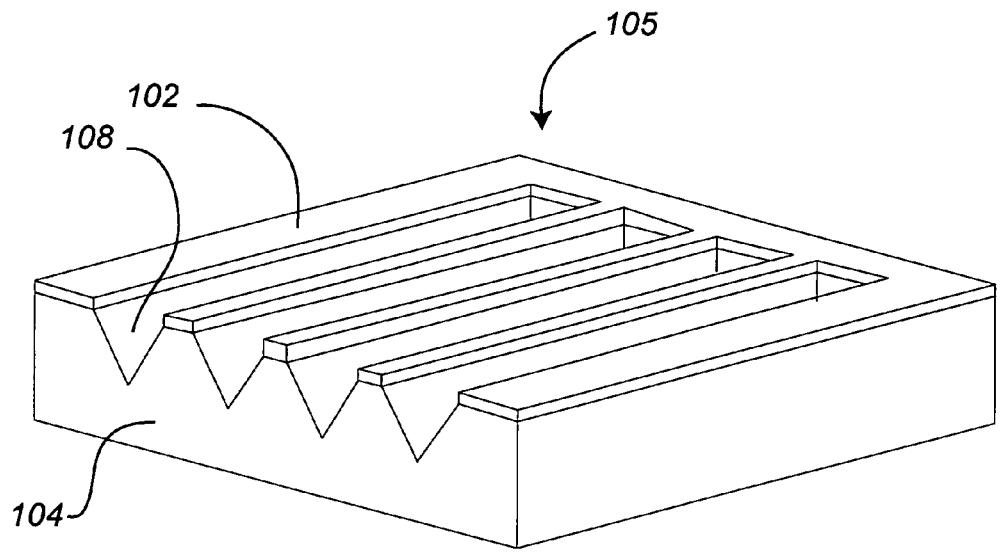
FIG. 3 is a schematic representation of the silicon body of FIG. 1, with a portion of the silicon body etched away.
Figure 4:
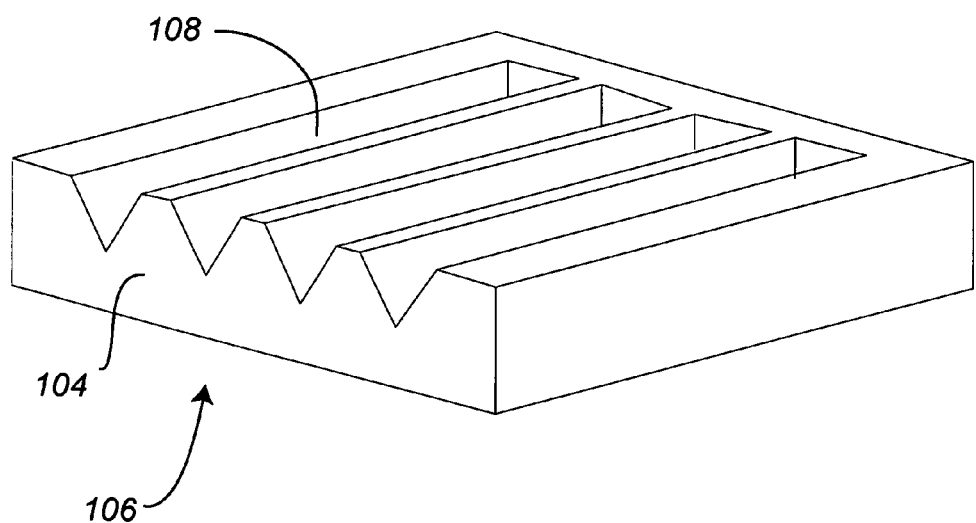
FIG. 4 is a schematic representation of the etched silicon body of FIG. 3, with all of the resist layer removed to form a master mold.

A workpiece that will become a master for casting stamps is shown at different stages of such a typical process in FIGS. 1-6. As shown in FIG. 1, a layer of thermal oxide 102 is grown on a 1-0-0 silicon wafer 104. A pattern of open rectangles 103 (FIG. 2) is provided 1402 (FIG. 14) in the thermal oxide layer 102 by any suitable means, for instance standard photolithography, followed by treatment with commercially prepared Buffered Oxide Etch (BOE), to create an etch mask 105. The pattern of the mask may typically consist of openings on the order of 5-12 μm width, spaced at intervals of 10-25 μm. Etching 1404 anisotropically creates tapering features 108 (FIG. 3) in the silicon block, for instance grooves 108 with a triangular cross section. A hot aqueous solution of KOH is typically used as the etchant, since it etches different grain orientations at different rates, generally yielding sloping sidewalls forming a 54.7 degree angle with the original plane surface. This technique is used in MEMS (Micro Electro Mechanical Systems) fabrication. The patterned thermal oxide mask 105 is then stripped 1405, e.g., using BOE from the silicon wafer 104 (FIG. 4), which is now a patterned master 106 for creating stamps 110 discussed below.

Figure 5:
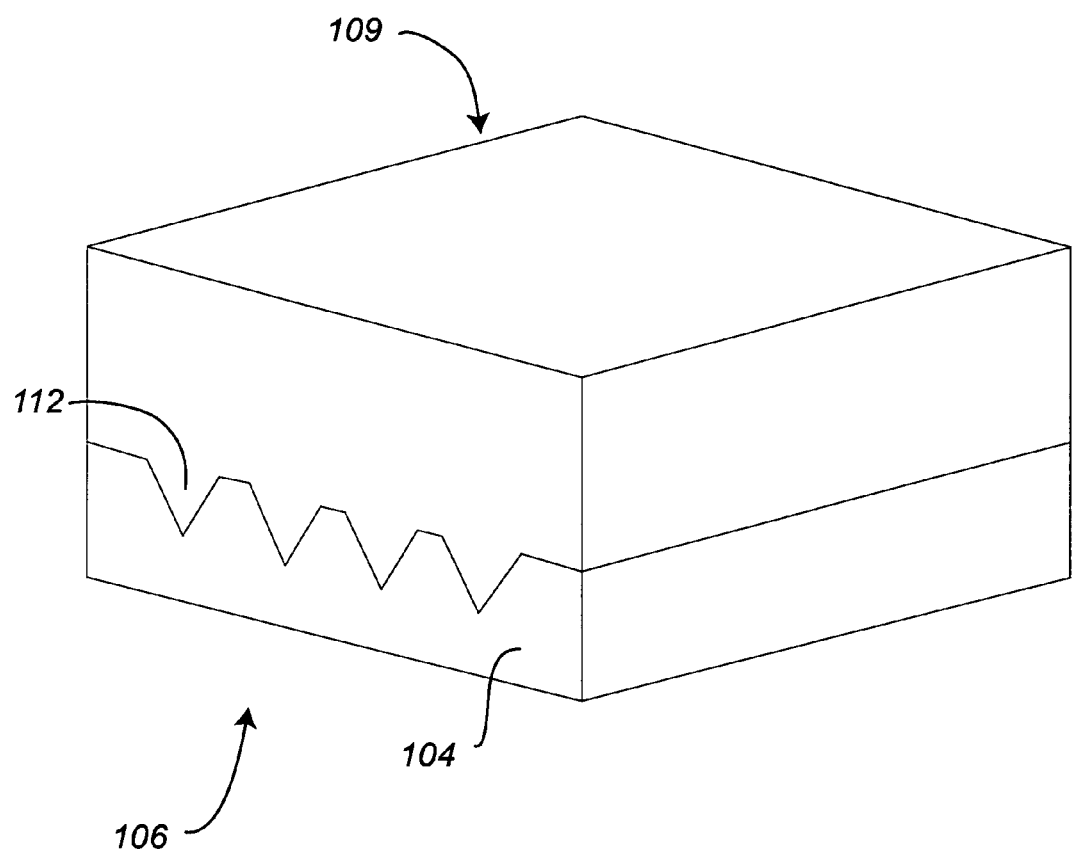
FIG. 5 is a schematic representation of the master mold of FIG. 4, charged with molding material.
Figure 6:
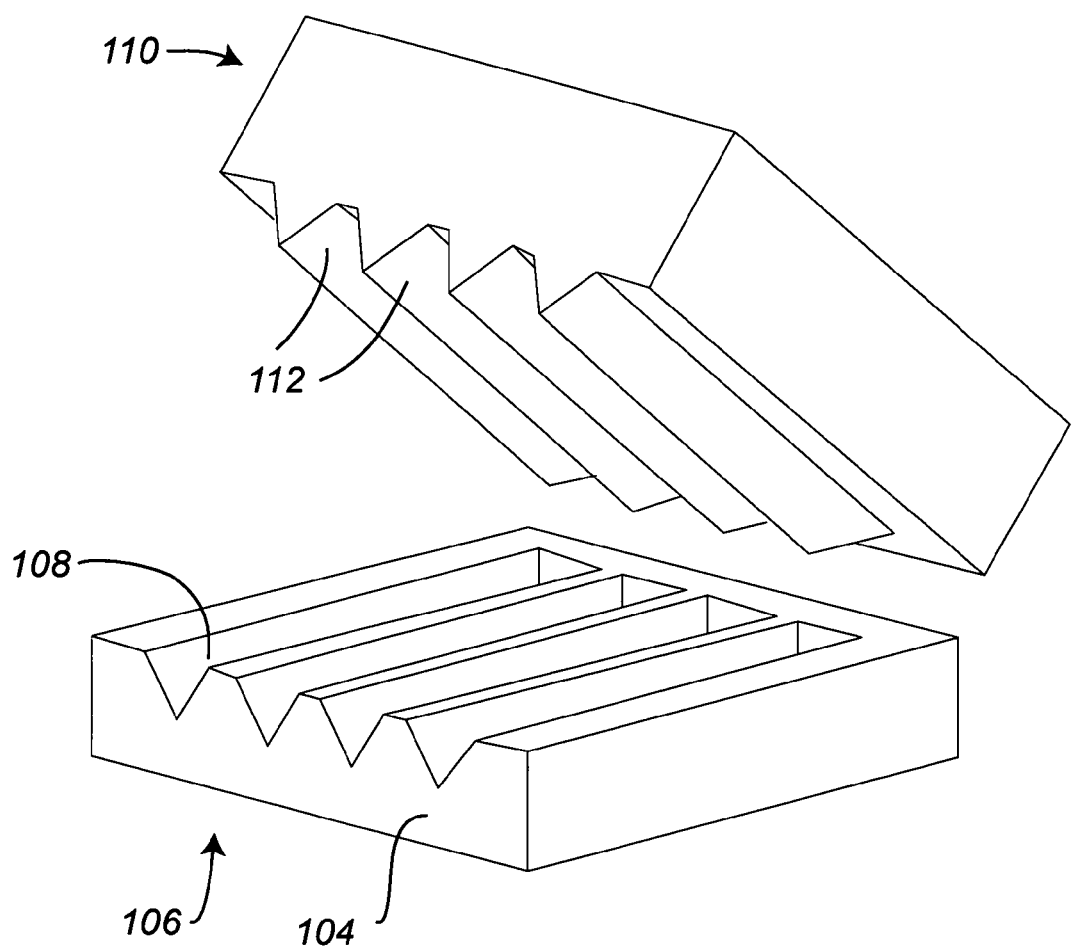
FIG. 6 is a schematic representation of the master mold of FIG. 4, with the molded molding material being peeled away, to form a stamp.

Referring to the steps shown schematically in flow chart form in FIG. 15, and to FIG. 5, a silane release agent, typically trichloro(1H,1H,2H,2H-perfluorooctyl)silane, is vapor deposited 1502 on the master 106 under low vacuum at room temperature. Next, a castable elastomeric material 109, for instance PDMS (Polydimethylsiloxane, also known as silicone rubber) and preferably Dow Corning Sylgard 184 is cast 1504 against the master 106 to create protruding features 112 with sloping side walls, which form an inverse copy of the features 108 formed in the silicon wafer 104. The Sylgard product has a hardness of approximately 50 on the Shore A durometer scale, with an elastic modulus on the order of 2 MPa. Depending on the smoothness of the surface to be patterned, significantly harder elastomer materials may be used, for instance polyurethane elastomers, with elastic moduli in excess of approximately 10 MPa. For very smooth surfaces such as conventional polished silicon substrates, it is anticipated that stamp materials with moduli on the order of 10 GPa may be effective. The casting material is peeled away 1506 to form a stamp 110 (FIG. 6), having protruding features 112, for instance extended triangular cross-section ridges. The stamp 110 is used in steps discussed below to pattern substrates for use in solar cells. The master 106 can be used again to make another stamp 110. The stamp-forming process described here is not integral to an inventive method, and other stamp forming techniques may be employed, for instance injection molding or reactive injection molding with commercially available elastomers formulated for those molding processes. Similarly, other materials and techniques for making masters may be employed without departing from the scope of inventions disclosed herein.

A linear feature 108 anisotropically etched into the silicon master 106 results in an extended triangular cross-section wedge 112 in the stamp 110. As shown in FIGS. 17-27, a square etch feature 1108 in a master 1106 results in a pyramidal raised wedge feature 1112 in the stamp 1110. Inside corners tend to undercut when using the anisotropic etch system, but techniques are known that allow inside corners to be fabricated, typically by precompensating in the initial pattern geometry for the accelerated etch rates that occur there. Typical relief (feature height relative to the base plane) can vary widely but is preferably in the range of 3-10 μm. The process steps for making and using unitary pyramidal raised features are discussed briefly below.

Figure 7:
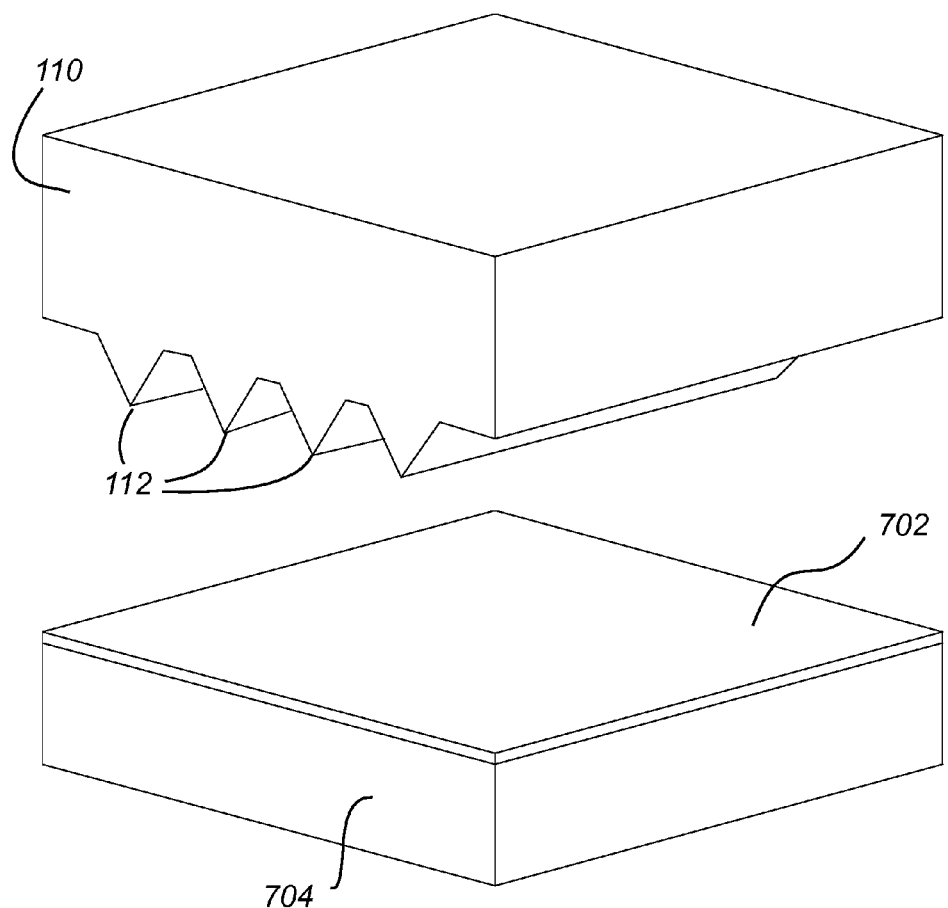
FIG. 7 is a schematic representation of the stamp of FIG. 6, being brought in proximity with a substrate coated with a resist, such as wax.
Figure 8:
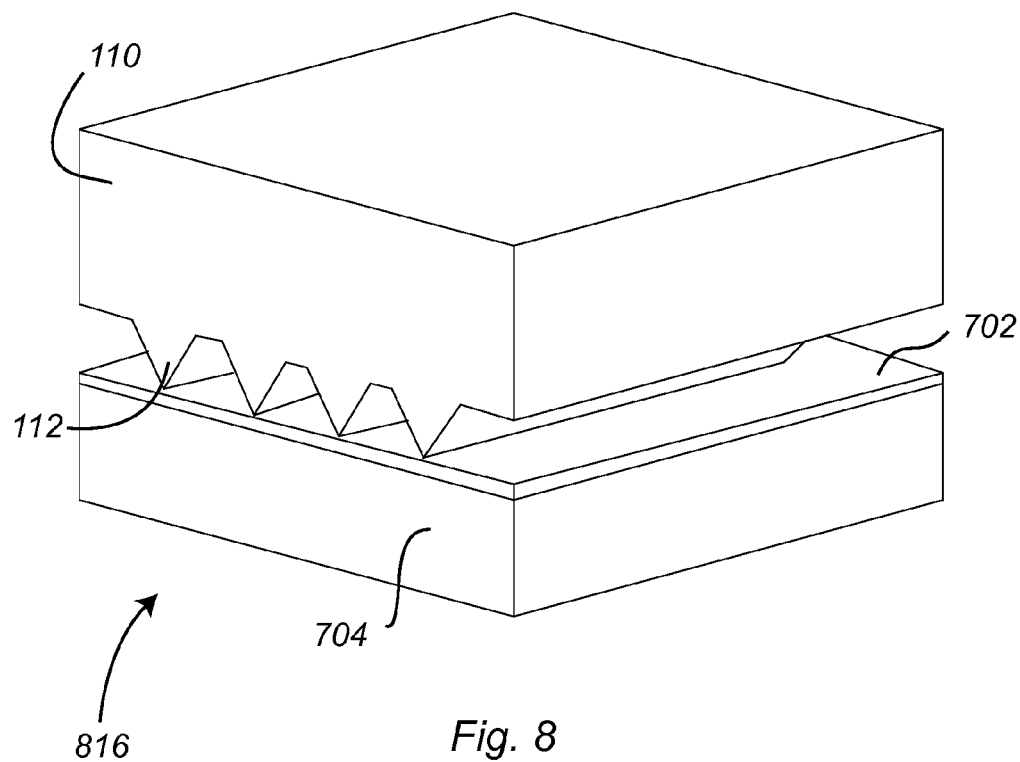
FIG. 8 is a schematic representation of the stamp of FIG. 6, contacting the resist layer.
Figure 9:
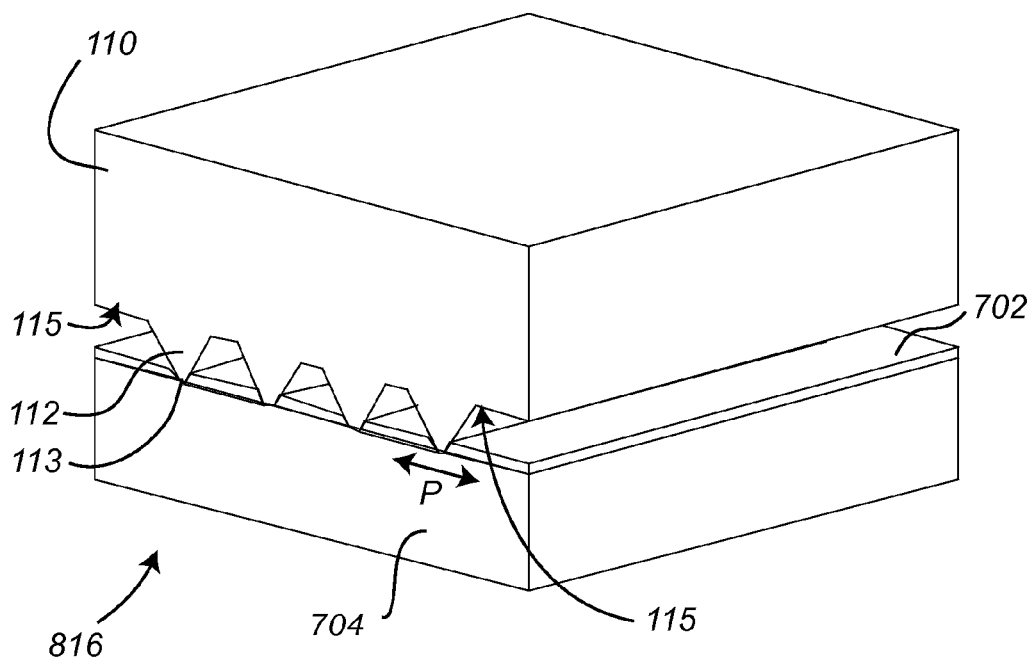
FIG. 9 is a schematic representation of the stamp of FIG. 6, contacting the resist layer, and subjected to heat and pressure, such that the resist layer softens and flows out of the way, so that the protrusions of the stamp touch, or very nearly touch, the substrate.
Figure 10:
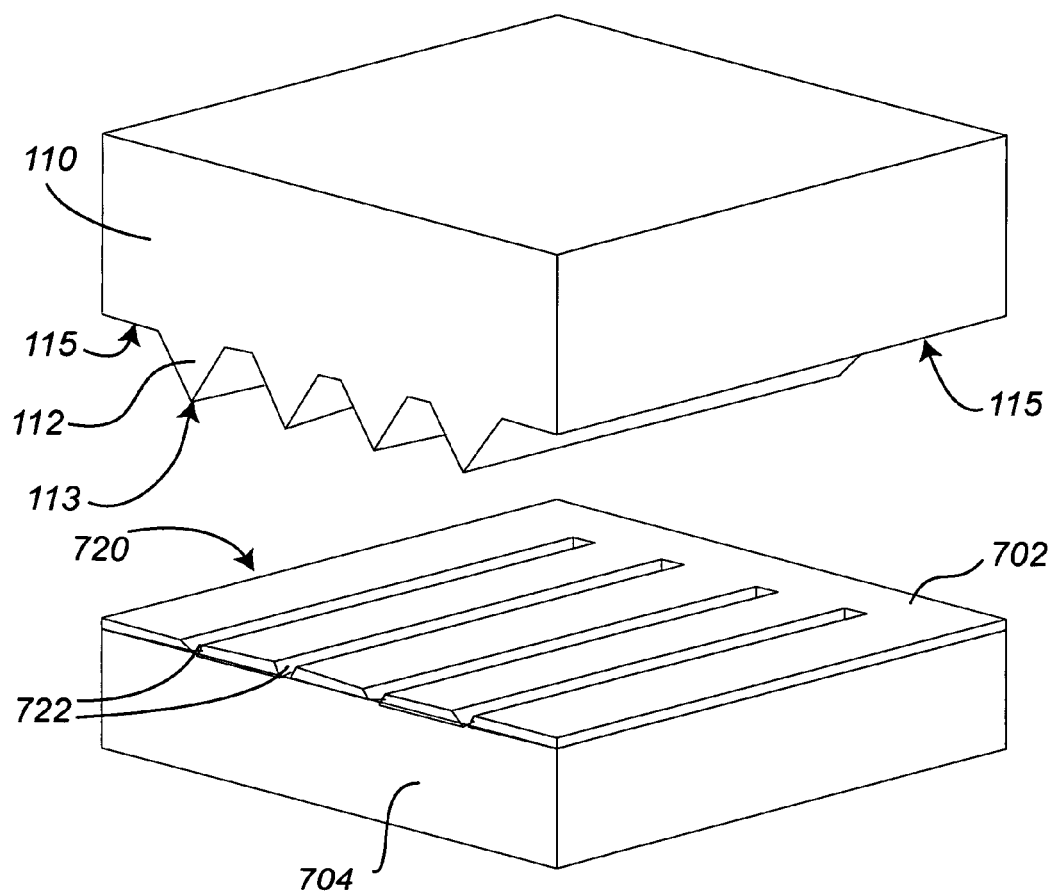
FIG. 10 is a schematic representation of the stamp of FIG. 6, after contacting the resist layer, and subjected to heat and pressure, such that the resist layer has flowed out of the way and solidified, revealing the substrate in locations that make up a specific pattern.

A typical sequence of using stamp 110 begins with application 1302 of a thin layer 702 (approximately 1-5 micron) of a heat-flowable organic resist material such as a synthetic or natural wax or a heat-flowable polymer such as polyolefin, to a substrate 704 (FIG. 7). For example, the substrate, 704 may be wire-sawn multicrystalline silicon wafer feedstock of approximately 200 μm thickness, which has been subjected to an isotropic HNO$_3$/HF etchant to remove microscopic damage to the crystal structure that comes about in the wafer sawing process, a process that is well known in the art of silicon photovoltaic fabrication. Commonly-available wafer stock so prepared may have a typical wavy surface topography of approximately 2 to approximately 8 microns peak-to-trough, in contrast to the jagged irregular surface of the as-sawn material. Other substrates are also susceptible to the techniques described here, including but not limited to wire-sawn monocrystalline wafer stock, conventional polished silicon wafers and continuous flexible films including but not limited to thin film solar cells. Where a jagged as-received surface is not present, the damage etch may be dispensed with. The process has also been demonstrated on as-received wire-sawn wafer stock with good fidelity to the pattern.

A variety of waxes and polymers may be used for the resist layer 102, including carnauba, PEG carnauba, siliconyl carnauba, candelilla, and microcrystalline waxes and branched chain polyolefin polymers, but a resist material with good adhesive properties and relatively high fracture toughness is preferred. A preferred formulation is Koster Keunen Stick Wax 77, a blend of synthetic beeswax, microwax, rosin, hydrocarbon resin, and additives available from Koster Keunen Holland B.V., of Bladel, The Netherlands and Watertown, Conn. This material has a viscosity of approximately 1200 centipoise at 100° C. and a specific gravity of approximately 0.957. The resist material will preferably exhibit good flow properties at elevated temperature, including a relatively low viscosity preferably under 100,000 centipoise, more preferably under 10,000 centipoise, and still more preferably of approximately 1000 centipoise. Preferably the rheology of the resist material does not exhibit a shear yield stress, which would limit flow under pressure in confined spaces. Materials with higher viscosity in the flowable state may be used, though process time may be greater; materials with lower viscosity (such as paraffins) may also be used, though these may be more brittle, yielding poor adhesion. Preferable surface energy characteristics of the resist material in conjunction with the substrate and stamp are discussed further below.

The wax may be applied by spin-coating at elevated temperatures, for instance by directing a flow of hot air from a heat gun at the wafer chuck of a conventional spin-coating machine. In the development of methods disclosed herein a purpose-built heated spin coater was fabricated, and a preferable set of operating conditions was found to be 225° C. ambient air temperature, 100° C. wax delivery temperature, and spinning for 30 seconds at 6000 RPM, to give a film thickness in the range of approximately 3 to approximately 4 microns with the Koster-Keunen wax material. While spin coating is a convenient laboratory method for forming a uniform thin film, it is anticipated that in industrial practice wax may preferably be applied by faster and more material-efficient methods, such as spray, curtain coating, gravure printing, offset gravure printing, rod coating, roll coating, blade coating, extrusion coating, or other coating techniques known in the art. Where spraying is employed, it may be beneficial to dilute the resist material with a suitable solvent to reduce viscosity, in order to achieve a thinner or more uniform film, which solvent may subsequently be driven off by evaporation. Depending on the deposition process, a brief heating step following deposition may be desirable to reflow or consolidate the resist material and increase the uniformity of the coating. It should also be noted that the mode of delivery of wax to the stamp-substrate system is not fundamental to the wedge imprint technique. As will be described below, it may be preferable that the resist material be provided in discontinuous regions on the substrate rather than as a continuous film. The techniques described above all provide the wax in the form of a thin film pre-applied to the wafer. But it could also be sprayed or otherwise coated onto the stamp, delivered as a free film, laminated to the stamp or substrate from a web, or provided in bulk molten form into the space between the substrate and the stamp, in which case the excess material is ejected laterally during the imprinting process. This approach may be especially beneficial in the case of a wedge imprint system with the wedge tool provided in the form of a rotary drum, as discussed elsewhere in this document.

An elastomeric stamp 110 is brought in contact with the resist coated substrate 702, 704. The stamp may be made as described above of various elastomeric materials. Silicone (e.g. Dow Corning Sylgard 184) is a reasonable candidate due to its moderate elastic modulus, low surface energy, and high temperature stability. In contrast to the typical planar-top features of soft lithographic stamps, the stamp used in the present process has raised features 112 that are triangular in cross-section.

The linear wedge-shaped features 112 of the stamp 110 are pressed 1304 against the wax-coating 702 on the substrate 704 with a uniform pressure. The optimum pressure is dependent on temperature and duration of the thermal cycle, but total differential pressure in the range of approximately 100 to approximately 500 kPa (with the area calculated on the basis of substrate size) is observed to work well. It has been found useful to provide the differential pressure in whole or in part by application of vacuum between the substrate and the stamp, to reduce the possibility of trapped air, though this has not been found to be a serious issue. Use of vacuum with commercially available vacuum pumps effectively applies approximately 100 kPa to the interface, which is at the low end of the desired range of approximately 100-500 kPa. Additional pressure may be applied pneumatically or by other means to the side of the stamp opposite the raised features. In cases where the raised features of the stamp form enclosed regions, it may be preferable to first apply vacuum to both sides of the stamp, and subsequently vent the side opposite the raised features, again to facilitate escape of trapped air. The flexibility of the elastomeric stamp 110 allows the wedge features 112 to conform to irregularities in the surfaces of the substrate 704, including grain boundaries, saw marks, and imperfections owing to the damage etch. Since not only the raised features of the stamp are elastomeric, but also its bulk as well, disclosed methods are conformal and effective on surfaces with roughness up to and including on the order of the height of the raised features of the stamp, especially if some variation in opening dimension may be accepted.

The assembly 816 (FIG. 8) of stamp 110 and substrate 704 is then briefly heated 1306 (e.g. by IR lamps or resistive heating) above the temperature at which the wax 702 becomes flowable while under pressure and then rapidly cooled 1308 (e.g. by forced convection). When the wax melts or becomes flowable it is locally displaced in the areas under the tips 113 of the wedge-shaped stamp features 112, and it then solidifies in the desired pattern, upon cooling. A mechanical balance is established locally between the applied pressure and the elastic properties of the elastomeric stamp at the tips 113 of the wedge-shaped features 112, such that a consistent and repeatable width of the stamp 110 material will be deformed elastically into intimate contact with the base material of the substrate 704. In a preferable implementation, thermoelectric (Peltier) devices may be used bidirectionally to rapidly heat and cool the assembly. It is found that for the resist materials of interest, a temperature of 90° C. for a period of 10 s is typically sufficient to pattern the substrate, with indications that even faster cycles will work as well.

Some materials may not exhibit a solid-to-liquid phase transition in the technical sense, but nonetheless be effectively immobile at room temperature but become effectively flowable at elevated temperatures, as characterized by a viscosity less than approximately 100,000 centipoise. It is further possible that beneficial resist materials may be found that are flowable at normal room temperature but effectively immobile at reduced temperature, and the process described herein may be readily adapted to such materials by lowering the ambient temperature of the process.

Additional pressure applied to the stamp will widen the open region, giving a broader area of clearance, while reduced pressure will have the opposite effect. In practice it is found that in the case of stamps bearing elongated linear wedge shaped raised features, openings of 1 μm or less along the direction indicated by the double headed arrow P on a 20 μm pitch, may be formed readily and consistently by these techniques with no more than customary care in controlling process variables. In the case of stamps with pyramidal raised features such as shown in FIGS. 22-25, square openings ranging from approximately 1 to approximately 6 microns on a side may be readily formed. The larger opening dimension in the case of isolated pyramidal features presumably owes to the reduced contact area, resulting in greater effective local pressure. In many cases the wax film 702 will be thick enough to fill the volume (FIG. 9) defined by the space between the tips 113 of the wedge features and the plane 115 of the stamp as compressed, but in the case of very thin films empty space 118 may remain between the wax film and the recessed surface 115 of the stamp. In this case the possibility exists for spontaneous dewetting of the substrate surface by the resist material, which may disrupt the desired resist pattern.

In contrast to a nanoimprint patterning process, it is observed that if the surface characteristics of the substrate 704, stamp 110, and wax 702 are chosen appropriately, and the viscosity of the wax is sufficiently low, the wax 702 will de-wet the substrate 704 locally under the tips of the raised features 112. This eliminates any costly residue removal steps such as are common in nanoimprint processes. This de-wetting behavior may be expected to occur especially where the combined interfacial energy of the wax-stamp and wax-substrate interfaces exceeds that of the stamp-substrate interface, thus rendering complete ejection of the wax resist material thermodynamically favorable. The wedge-shaped profile of the stamp is observed to facilitate this process, especially in cases of a rough substrate, in part by reducing the tendency of resist material to be trapped in pits on the substrate surface. The relatively low viscosity and favorable fluid properties of the flowable resist material are also important in eliminating residual film.

Once cooled 1308, the wedge imprint stamp 110 is retracted 1308 from the substrate 704 (FIG. 10), leaving the finished pattern 720 of channels 722 fully formed on the substrate 702 to form a masked assembly 724. The masked assembly 724 may be directed immediately into an etch bath, a deposition chamber, or other processing equipment as required by the specific microfabrication process flow.

In general, any of the following etching processes may be used, as appropriate for the specific process at hand: wet etching; isotropic etching; anisotropic etching; dry etching; reactive ion etching, and deep reactive ion etching.

Figure 27:
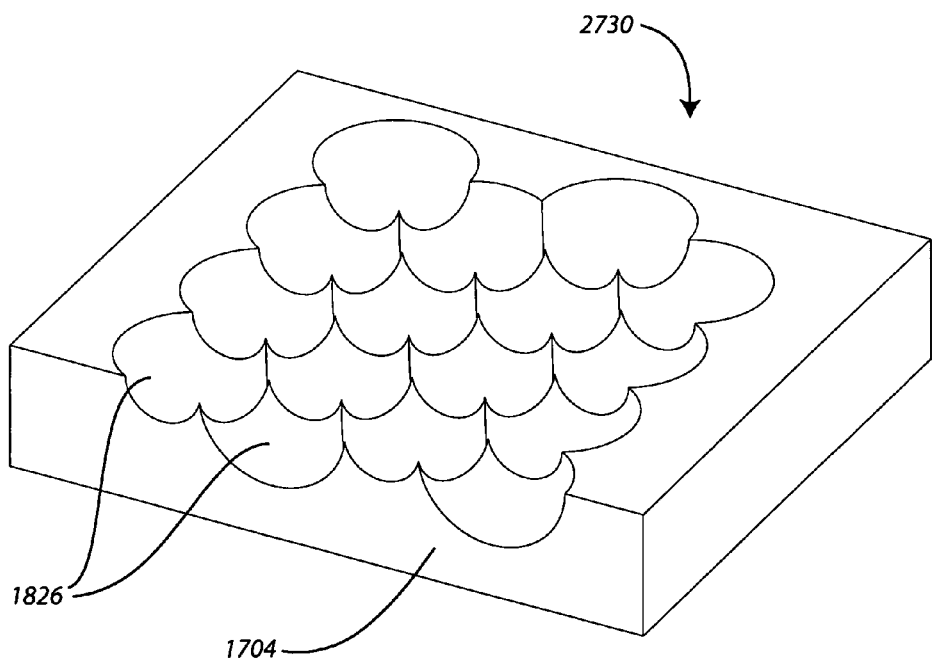
FIG. 27 is a schematic representation of the etched substrate shown in FIG. 11, after the resist layer, has been removed, to reveal etched pits.

To give one specific example, shown in FIG. 11, the masked wafer assembly 724 may be etched 1310 for approximately 1-2 minutes in a bath of 6:1:1 $HNO_3:CH_3COOH:HF$, to form isotropic grooves 826 or pits 1826 (FIG. 26) corresponding to the imprinted pattern 720. The wax 702 is then removed 1312 to reveal a textured substrate bearing contiguous linear grooves 1230 (as shown in FIG. 12) in the case of a stamp with linear wedge features, or as shown in FIG. 27, an array of contiguous, slightly overlapping substantially hemispheric pits 1826 in the case of a stamp such as shown at 1110 of FIG. 21 with pyramidal features 1112. Such structures may be used in photovoltaic applications, and are well known to provide significant benefits in light capture and current production of silicon solar cells. These benefits have been unavailable to processors of multicrystalline PV cells due to the cost and complexity of existing patterning techniques. While the examples given previously cover the specific examples of linear groove texture and hexagonal arrays of hemispheric pits, a wide variety of structures may be thus fabricated. For instance, structures of intermediate length between the elongated and square pyramidal examples are readily produced, as are other arrays in addition to the hexagonal array described. Similarly, extended ridges and arrays of discrete pyramids can be used in combination.

While the processes described above involves bulk removal of substrate material by wet isotropic etching, the processes have general applicability in microfabrication and other fields where patterns at the micron scale are desired. For example, a pre-deposited thin film (for instance a metal or dielectric) on the surface of the substrate could be selectively removed by a variety of wet or dry etching techniques, without materially affecting the substrate material itself. Not only subtractive but also additive processes are possible. For example, a reactive material could be applied to the surface of the patterned substrate and allowed to diffuse into the substrate selectively in the open areas. Alternatively, a patterned metallization may be performed by evaporating a thin uniform film over the patterned wafer in a directional deposition and subsequently dissolving the mask in solvent, removing the metal that was deposited on the mask, but retaining the metal that was deposited through the patterned openings. It is expected that in the case of wedge imprint patterning this lift-off technique will be limited to relatively thin or discontinuous films, since preferred implementations of lift-off involve a resist layer with overhanging features, which produce breaks in the metal film, facilitating attack by solvent.

Figure 16:
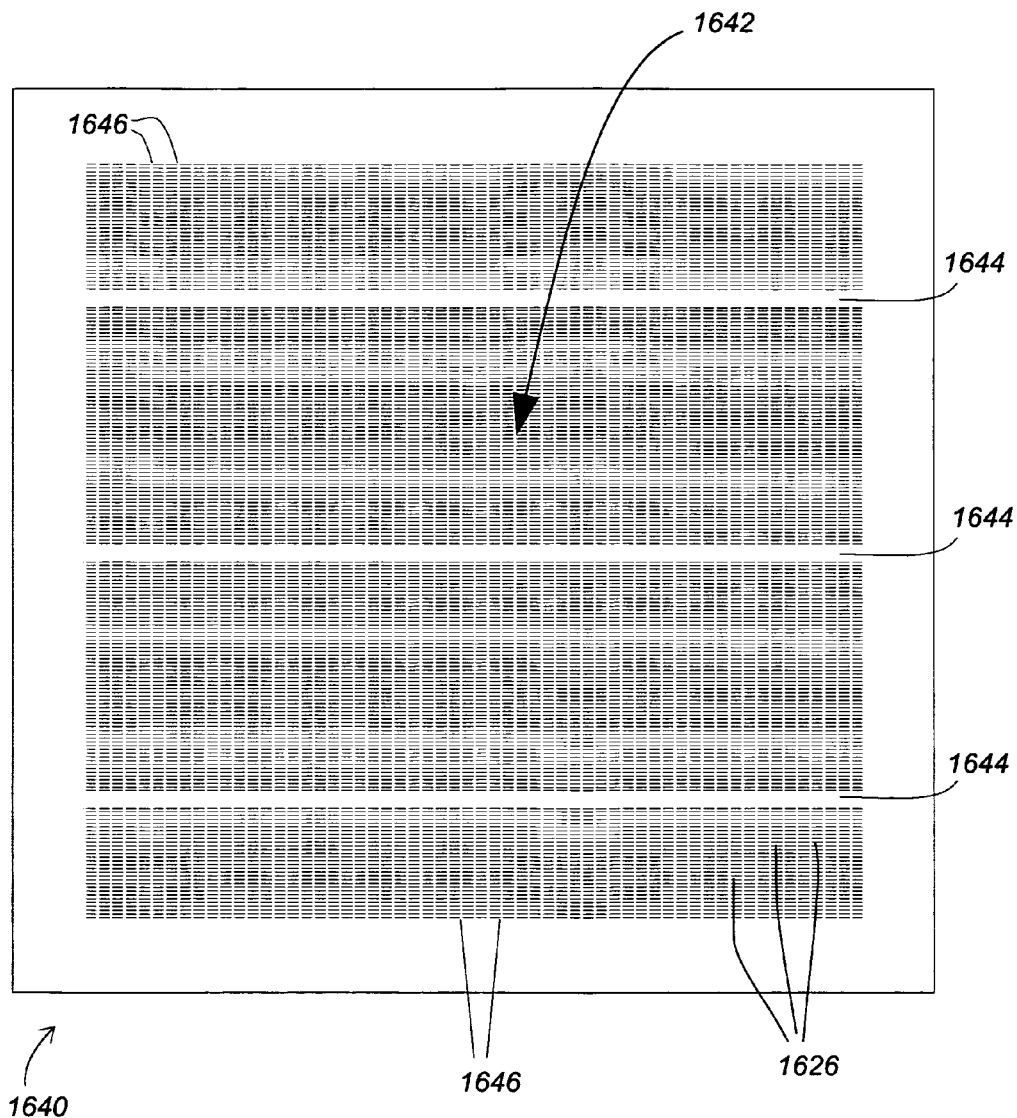
FIG. 16 is a schematic representation of a textured photovoltaic device, that has been textured using a stamp, as described herein.

A solar cell 1640, with a patterned surface 1642, made using a stamp, according to steps similar to those shown in FIG. 13 is shown, schematically, in FIG. 16. Grooves 1626 run across the cell face, from left to right, as shown. Bus wires 1644 run parallel to the grooves 1626. Metallization fingers 1646 intersect with the buswire 1544, and run perpendicular to the texture grooves 1626.

Figure 28A:
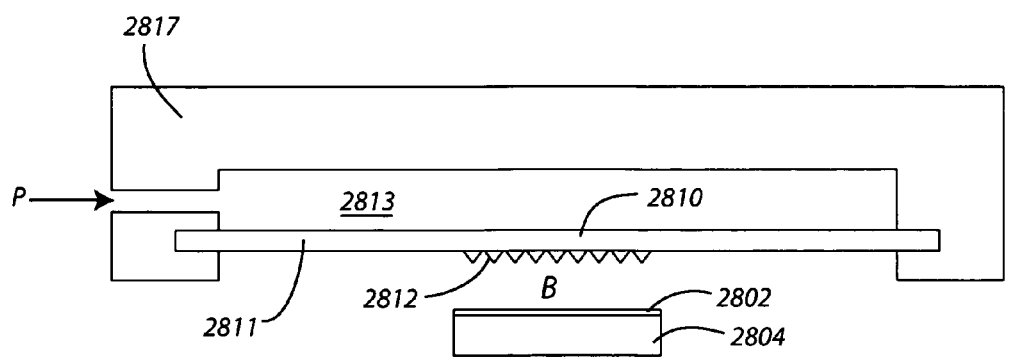
FIG. 28A is a schematic representation of an embodiment of an apparatus hereof, for patterning substrates, using a flexible membrane that is actuated by elevated pressure, in a relaxed state.
Figure 28B:
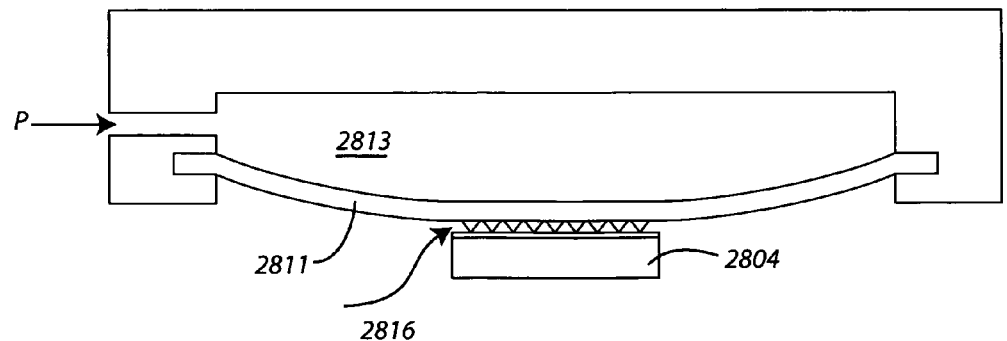
FIG. 28B is a schematic representation of the embodiment shown in FIG. 28A, in a pressurized state, with a stamp brought to bear upon a workpiece.

For small substrates on the order of 25 mm across, it may be convenient to implement the wedge imprint process with the PDMS stamp attached to a rigid platen, which is translated vertically as shown with reference to FIGS. 1-12 and 17-27. For a larger scale process, for instance 78 mm or 156 mm square substrates, maintaining planarity and pressure uniformity between the platen and the wax-coated workpiece becomes increasingly challenging. As shown with reference to FIGS. 28A and 28B, an apparatus 2817 has a PDMS stamp 2812 attached to a flexible rubber membrane 2811, such that uniform pressure P can be applied pneumatically to a substrate 2804 with wax 2802 across relatively large areas. As described above, it has also been found beneficial to apply a vacuum to the region 2816 between the stamp and the coated substrate during the process, to prevent the formation of defects due to trapped air.

The membrane 2811 is deflected toward the substrate 2804 under influences of pressure P inside cavity 2813. The protrusions 2812 of stamp 2810, carried by the membrane 2811 are pressed into the wax or other coating 2802 on the substrate 2804, under conditions of heat and pressure, as described above, such that the resist flows away and the substrate 2804 is exposed so that it can be etched, as described above, to form a textured wafer for photovoltaic use.

Figure 30:
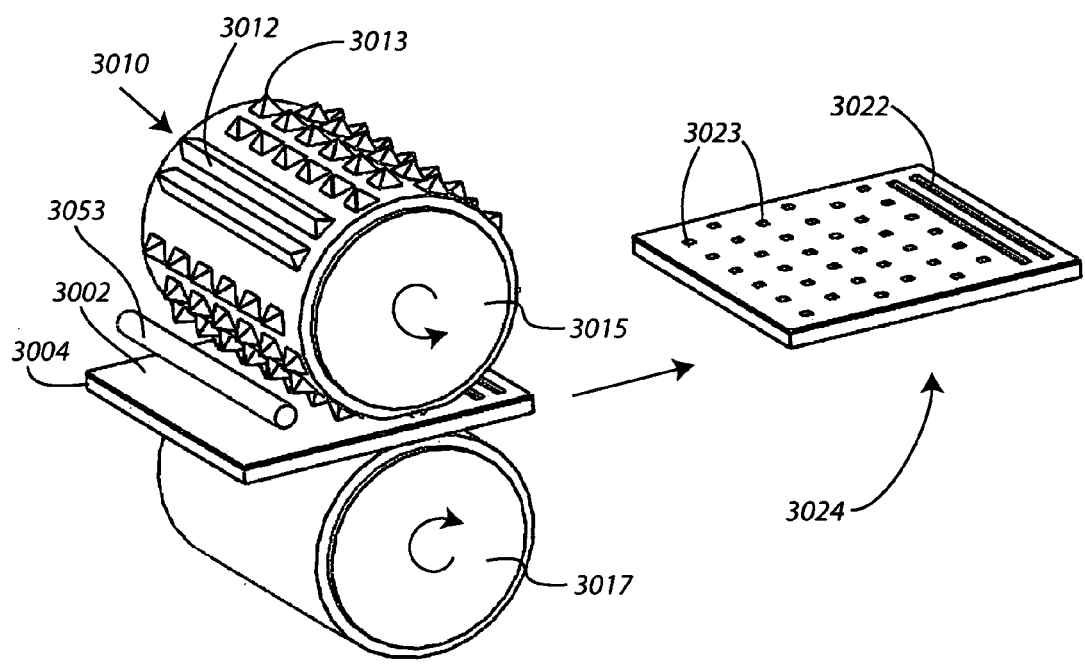
FIG. 30 is a schematic representation(s) of an embodiment of a method hereof, using a stamp mounted upon a rolling element.

Because the process time is little more than that required to heat and cool the stamp and substrate assembly 816, the techniques described above are also applicable to roll-based processing, in addition to the platen- and bladder-based technique described above. As shown in FIG. 30, in a rotary embodiment, wax 3002, coated substrates 3004 are passed between a roller 3015 carrying an elastomeric wedge imprint stamp 3010 and a linear preheat element 3053, such that the wax 3002 is melted just before introduction into the nip, flows, and re-solidifies generally as described above, while in the nip between the roller and backup roller 3017. Protrusions, for instance extended 3012 and discrete 3013, make similar impressions 3022, 3023, respectively, as described above for the extended, and below for the discrete. Wafers 3024 could thus be processed at rates compatible with modern solar cell processing equipment (1~2 second cycle time for 6 inch (15.24 cm) square wafers). Further, the roll based technique is not limited to rigid or to discontinuous substrates. Continuous, web-based substrates may also be patterned, provided a suitable continuous resist coating technique such as spraying or curtain coating is employed.

It is to be noted that the order of operations described above is not fundamental to the process. For instance, while in the primary example a wax coating on a substrate is first provided, then a stamp is disposed against the wax-coated substrate, and finally the assembly is heated and cooled, in the roll-based process just described, the order is, first provide the resist material, then heat, then dispose the stamp against the substrate, and finally cool. It is further noted that in the case where molten wax is sprayed on a hot substrate, the order becomes heat, provide wax, dispose the stamp against the substrate, followed by cooling, while the essential character of the process and the end result are unchanged. Further, it is possible to arrange the process such that in at least some regions of the substrate the order is (dispose stamp and heat, in any order), followed by providing resist materials. As will be discussed below, this last approach may be especially beneficial in cases where different areas of the desired pattern have different fidelity requirements, such as discussed in connection with FIGS. 35B and 36.

Figure 34:
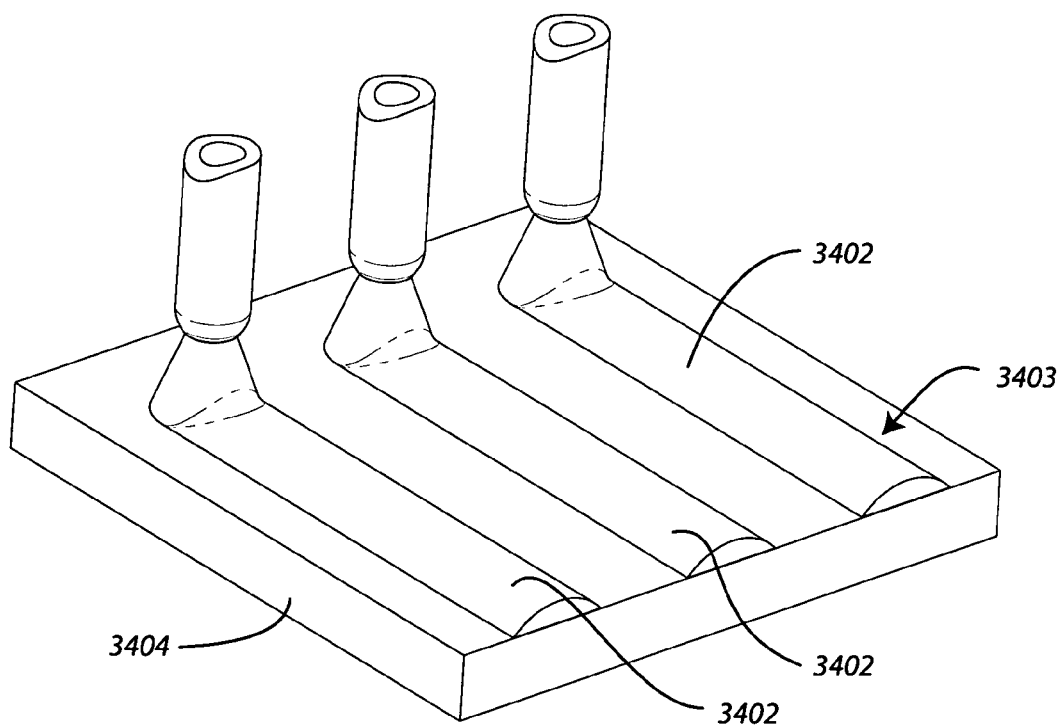
FIG. 34 is a schematic representation of a wafer, provided with heat flowable resist material provided in a coarse pattern.

It is also possible to provide a stamp wrapped around a roller, such as shown in FIG. 30, and to feed a substrate through the nip. Simultaneous with this heated flowable resist material may also be provided at the nip, so that it is substantially provided to the substrate, and patterned by the stamp. Although this is not shown in FIG. 30, the resist could be injected by nozzles, such as are shown in FIG. 34, into the nip upstream (to the left, as shown) between the linear preheat element 3053 and the roller 3010.

Figure 31A:
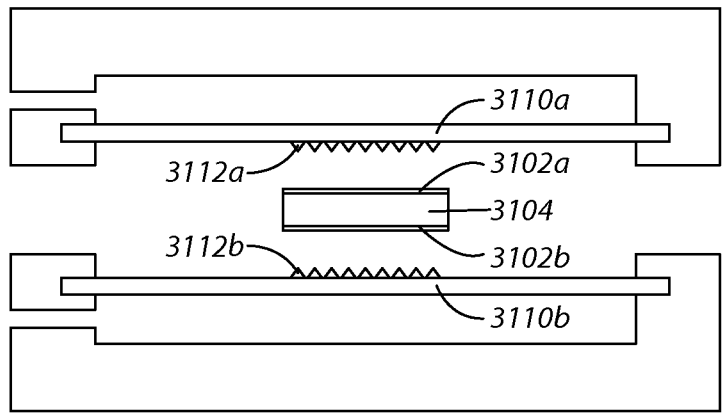
FIG. 31A is a schematic representation of an embodiment of an apparatus hereof, for patterning two sides of substrates, using a flexible membrane that is actuated by elevated pressure, in a relaxed state.
Figure 31B:
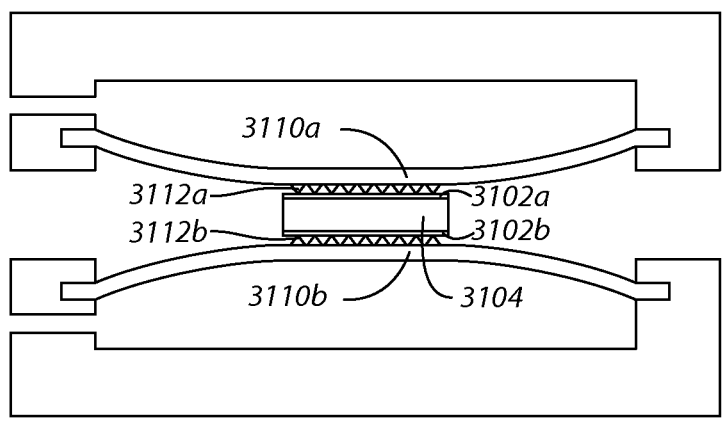
FIG. 31B is a schematic representation of the embodiment shown in FIG. 31A, in a pressurized state, with two stamps brought to bear upon a workpiece.
Figure 32A:
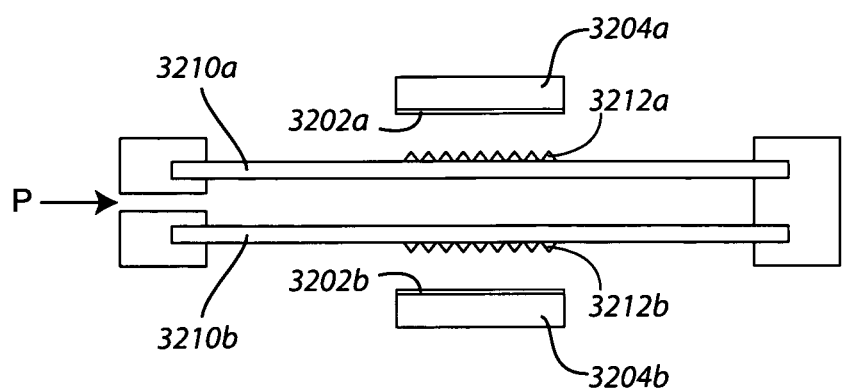
FIG. 32A is a schematic representation of an embodiment of an apparatus hereof, for patterning two substrates, using a flexible membrane that is actuated by elevated pressure, in a relaxed state.
Figure 32B:
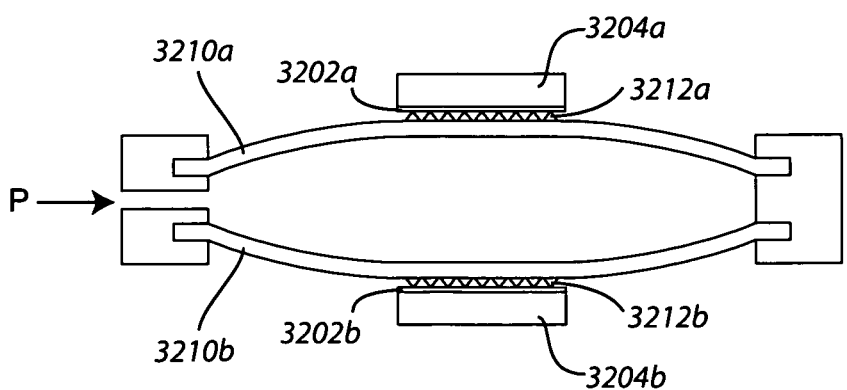
FIG. 32B is a schematic representation of the embodiment shown in FIG. 32A, in a pressurized state, with two stamps brought to bear upon two workpieces.

In some cases it may be beneficial to simultaneously pattern both sides of a wafer. For instanced, linear grooves oriented at 90 degree angles on opposite sides of a wafer are known to be an effective texture for trapping light within a solar cell. A method of the present innovations is particularly well suited to simultaneous patterning of two sides of a wafer. For instance, as shown schematically with reference to FIGS. 31A and 31B, a second membrane 3110b could be positioned below the wafer 3104, with the simultaneous action of the two membranes 3110a, 3110b implementing the wedge 3112a, 3112b imprint process on either side 3102a, 3102b of the wafer. Alternatively, as shown schematically with reference to FIGS. 32A and 32B, it may be beneficial to arrange to pattern two wafers 3204a, 3204b simultaneously within the same apparatus, for instance to increase the output of a proposed unit of manufacturing equipment. FIGS. 32A, 32B show two membranes 3210a, 3210b, simultaneously performing single sided patterning on each of two wafers 3204a, 3204b within the same apparatus. It is also possible (although not shown) to use three bladders, and with these to process two sides of two wafers, for a total of four sides of two wafers. The configuration can be extended to any number of wafers and sides desired.

Other shapes for stamps and final textures are possible. FIGS. 17-27 show stages of development of elements that will become a master mold, for making a stamp with unitary pyramidal wedge features, which will be used to create a textured surface having discrete pits that are roughly hemispherical in form and may be arranged in a hexagonal close-packed array. Hexagonal arrays of hemispheric pits form a very effective light trapping structure. Because the process is relatively similar to that described above in connection with the extended linear structures, it will not be described here in detail. However, figures are provided that are each directly analogous to a figure used to describe the extended methods, with reference numerals having similarly numbered least significant digits, with the most significant digits being different.

In general the correspondence between analogous figures is as follows:

| Extended | Discrete |
| --- | --- |
| 1 | — |
| 2 | 17 |
| 3 | 18 |
| 4 | 19 |
| 5 | 20 |
| 6 | 21 |
| 7 | 22 |
| 8 | 23 |
| 9 | 24 |
| 10 | 25 |
| 11 | 26 |
| 12 | 27 |

Figure 17:
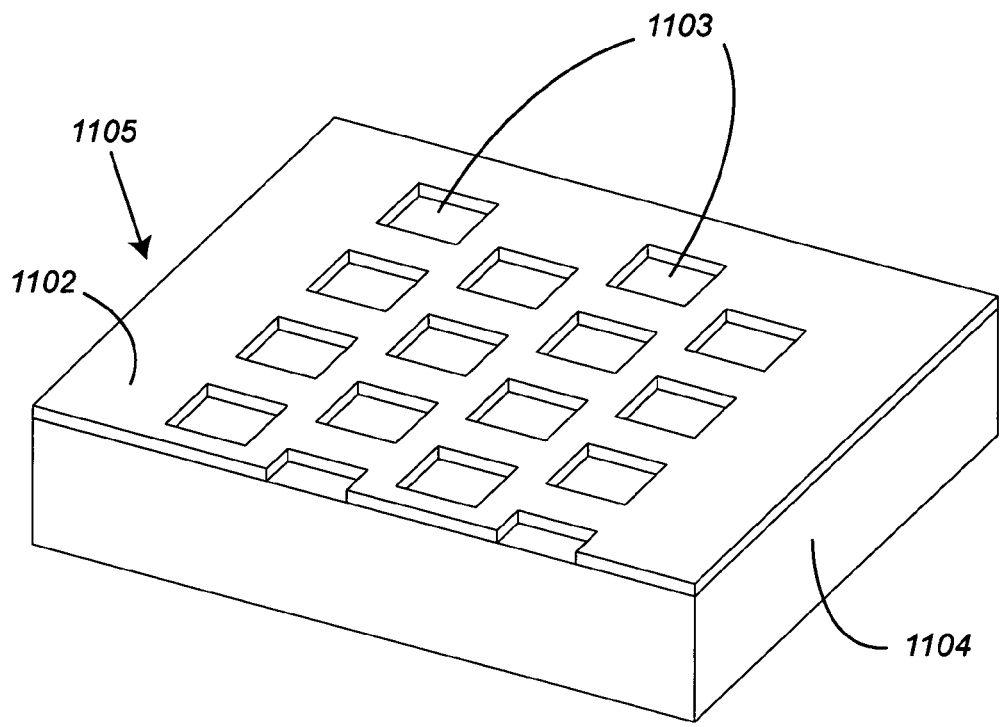
FIG. 17 is a schematic representation of a silicon body such as shown in FIG. 1, with a portion of the resist layer removed to form a mask having discrete, spaced apart openings that approximate a square.
Figure 18:
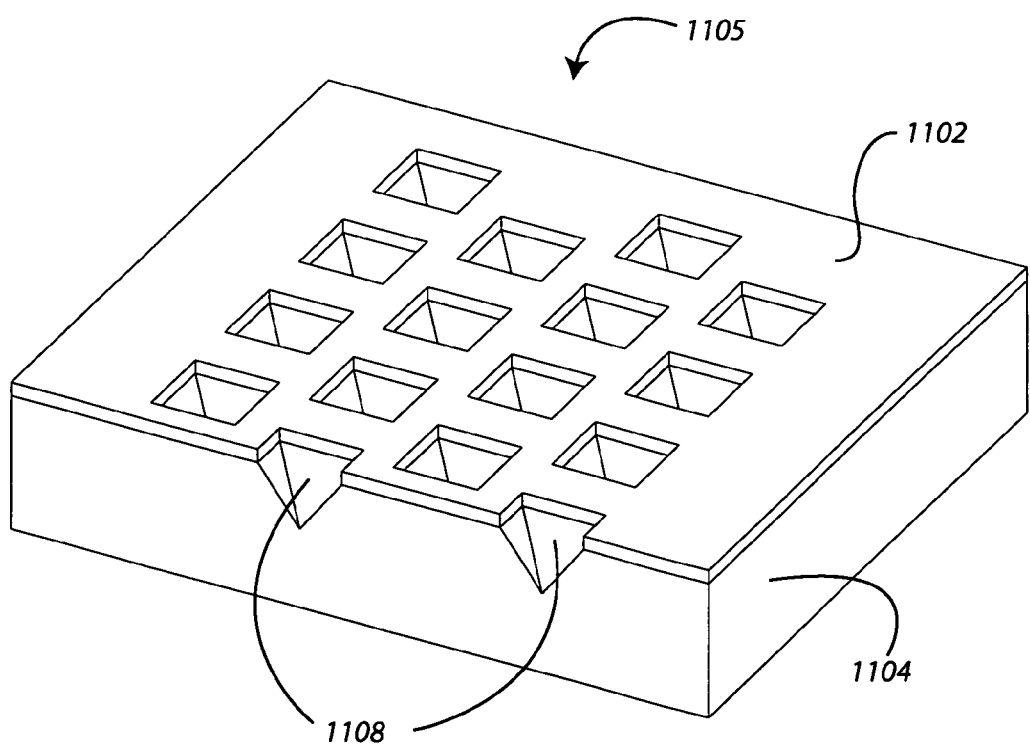
FIG. 18 is a schematic representation of the silicon body of FIG. 17, with a portion of the silicon body etched away to form pyramidal depressions.
Figure 19:
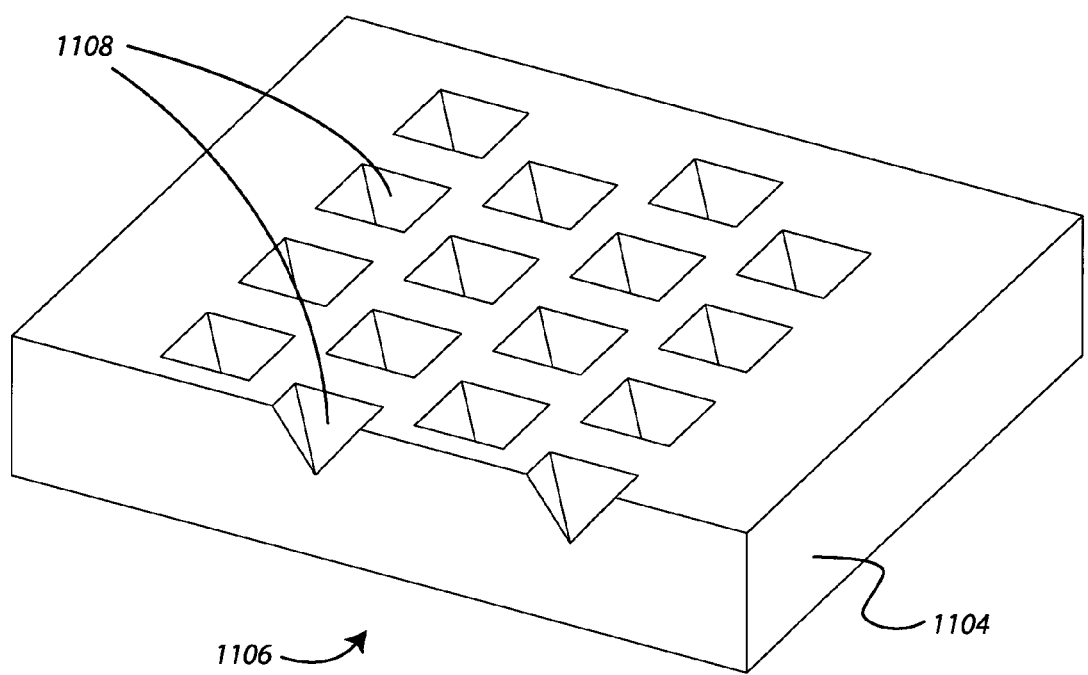
FIG. 19 is a schematic representation of the etched silicon body of FIG. 18, with all of the resist layer removed to form a master mold having pyramidal depressions.
Figure 20:
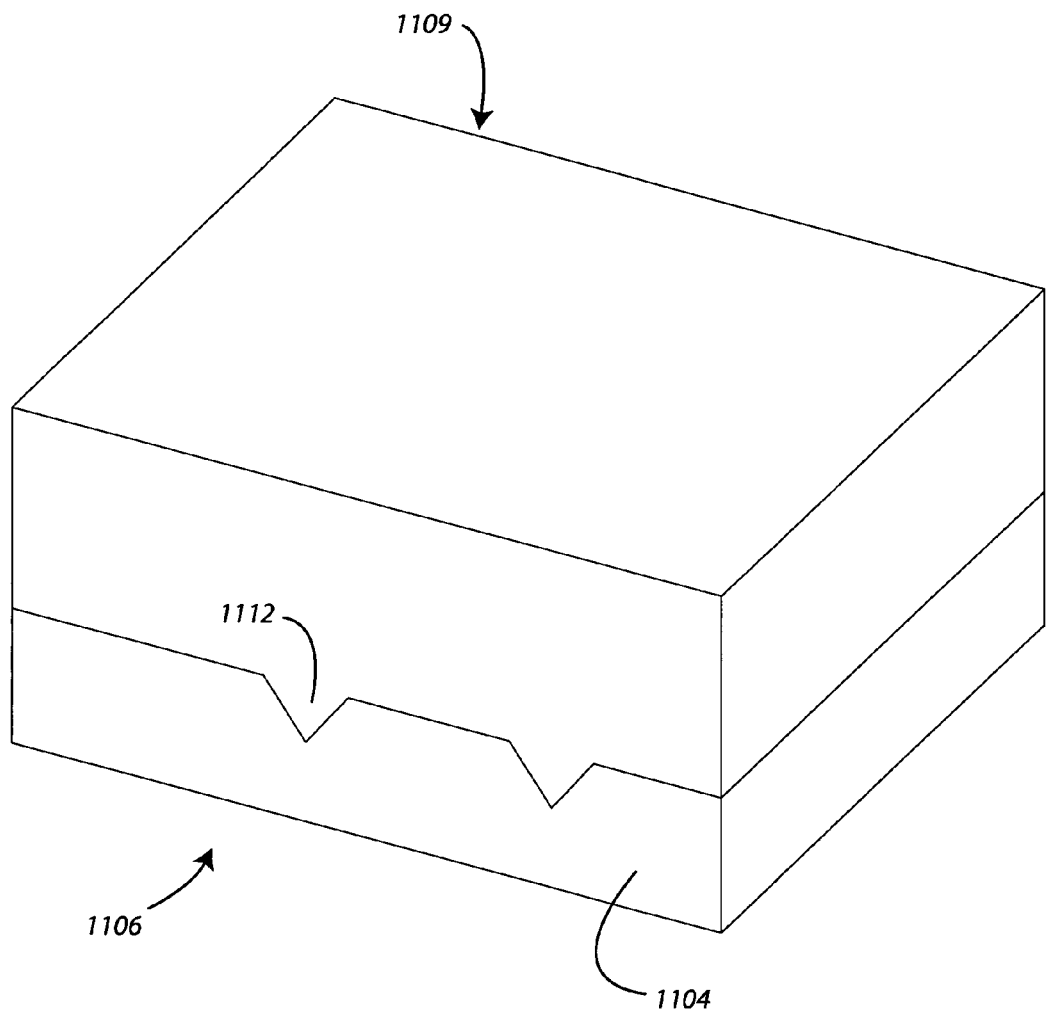
FIG. 20 is a schematic representation of the master mold of FIG. 19, charged with molding material.
Figure 21:
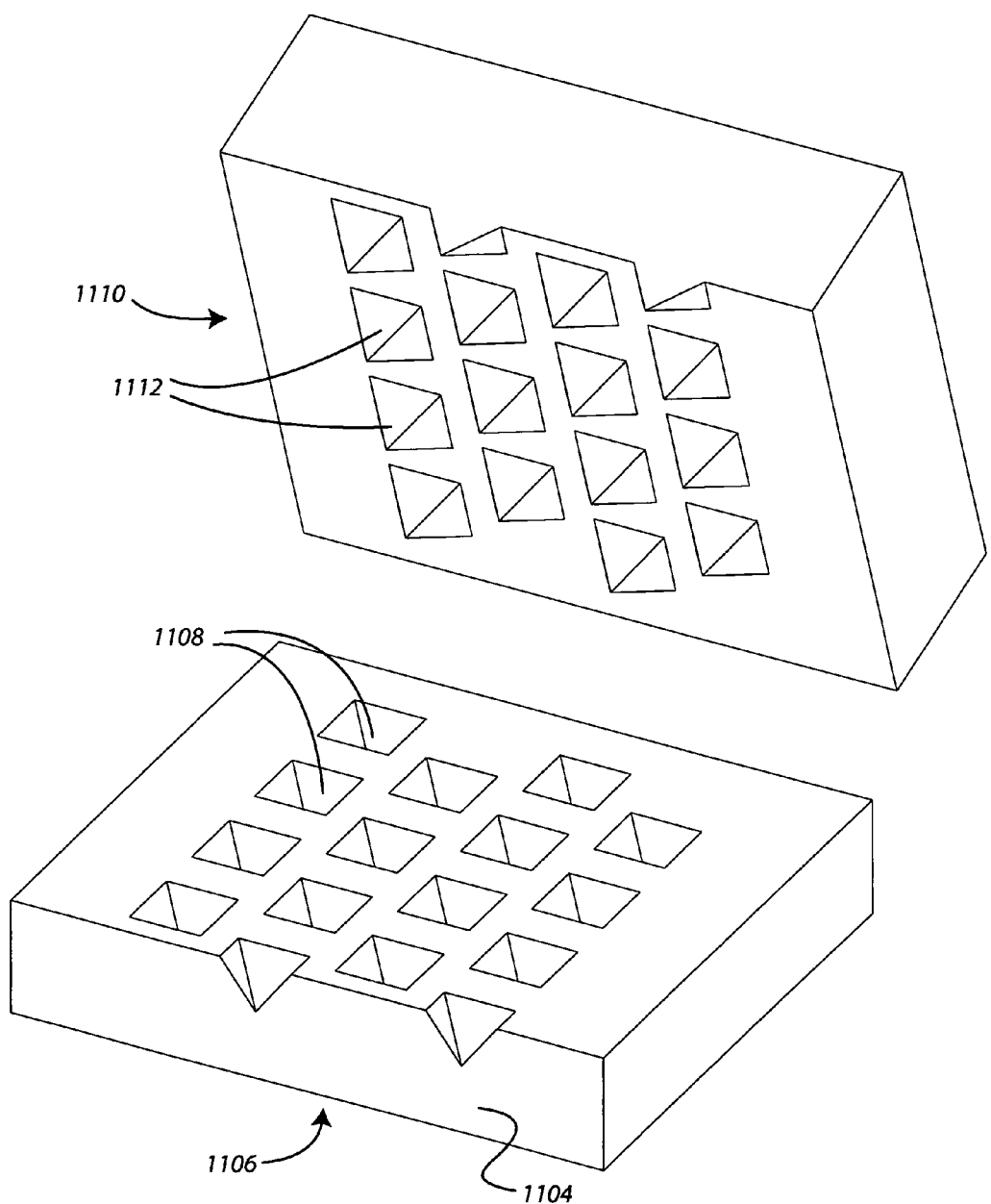
FIG. 21 is a schematic representation of the master mold of FIG. 19, with the molded molding material being peeled away, to form a stamp having pyramidal protrusions.
Figure 22:
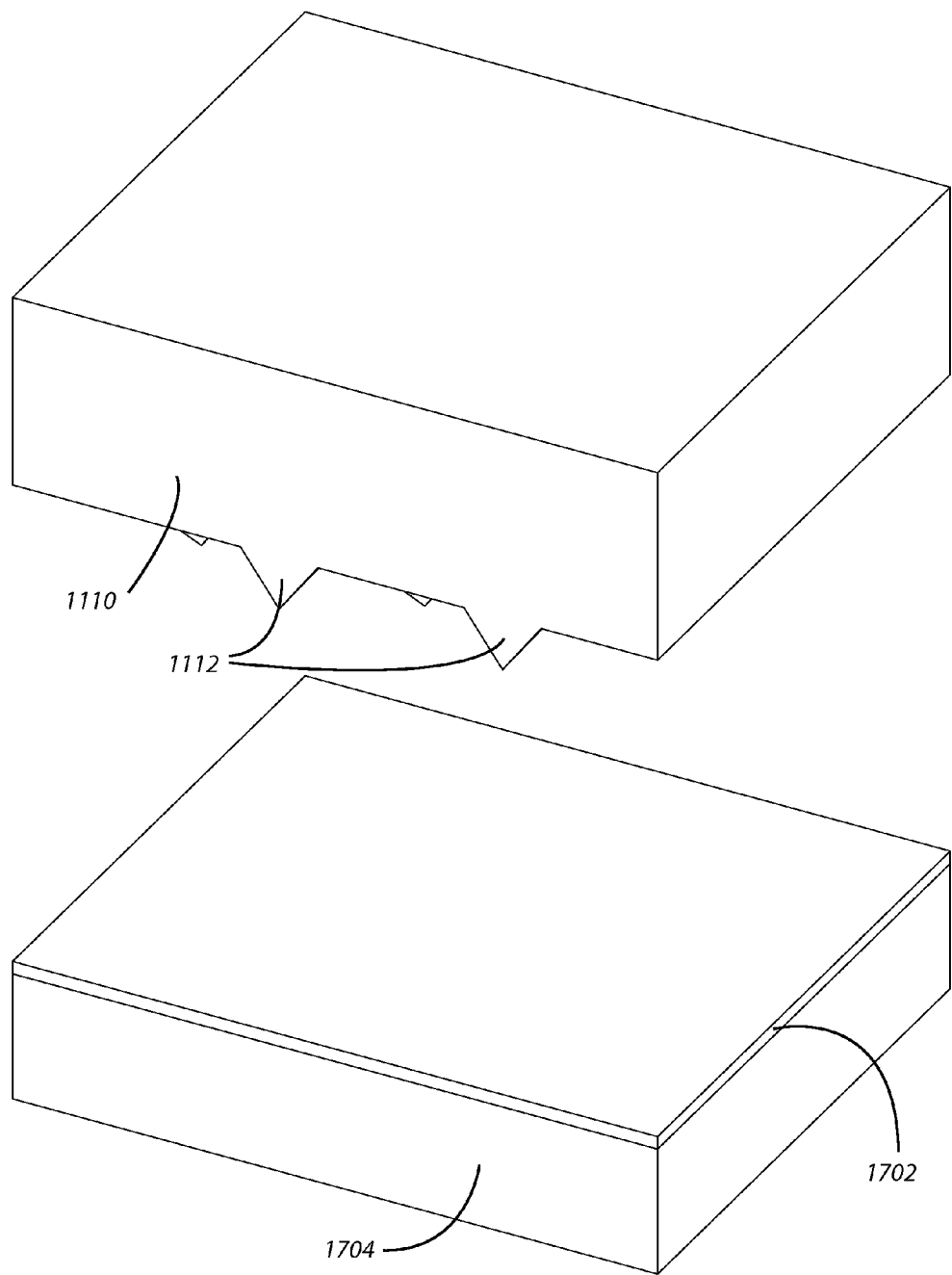
FIG. 22 is a schematic representation of the stamp of FIG. 21, being brought in proximity with a substrate coated with a heat flowable resist, such as wax.
Figure 23:
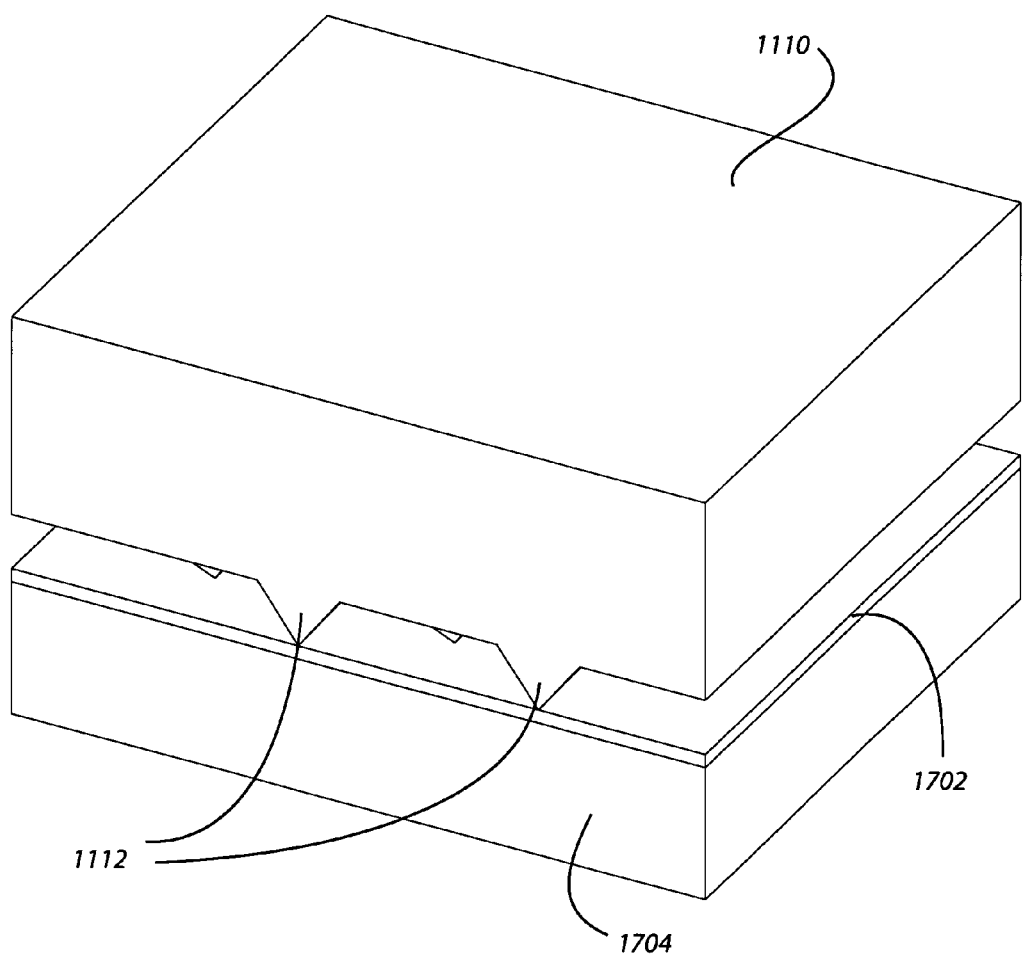
FIG. 23 is a schematic representation of the stamp of FIG. 22, contacting the resist layer.
Figure 24:
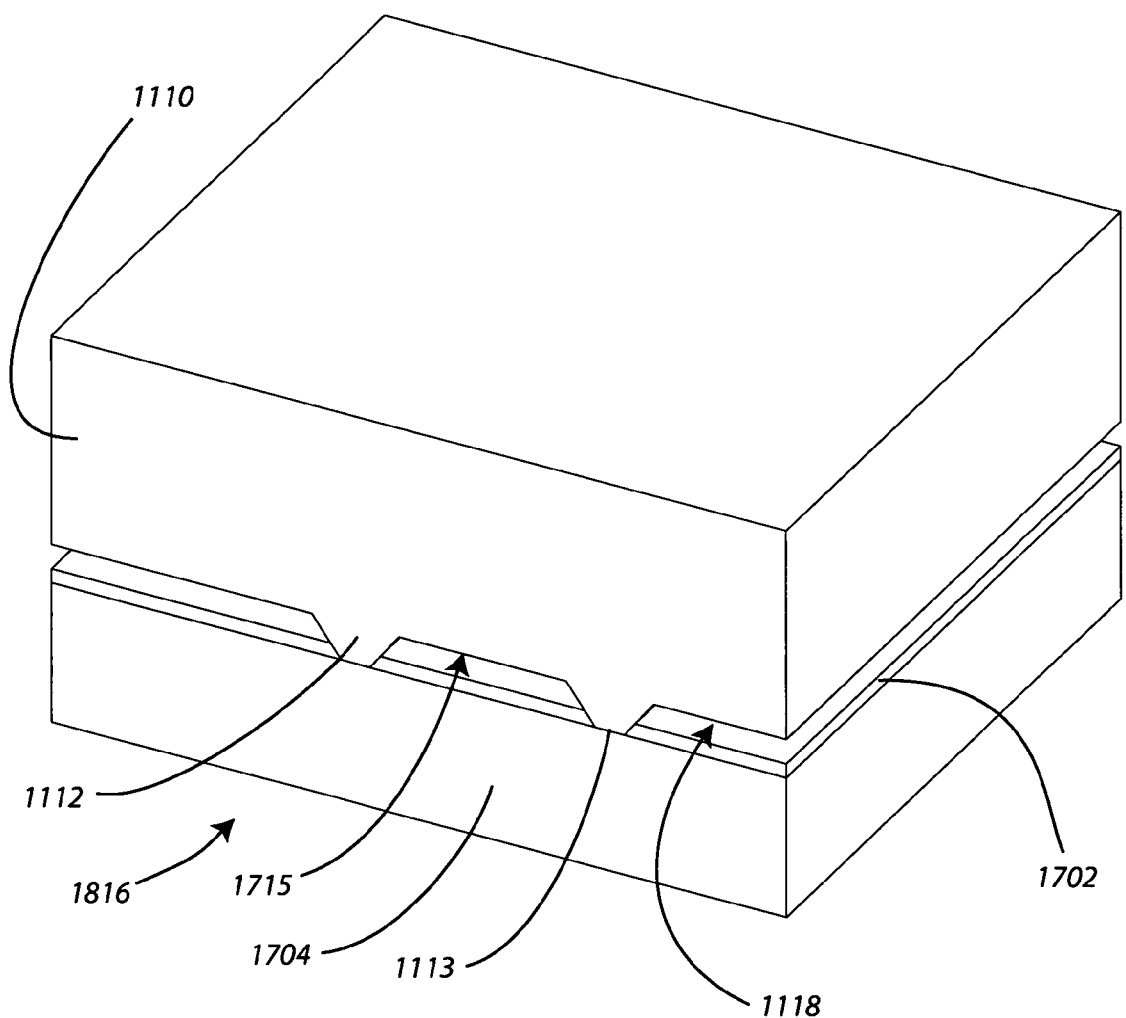
FIG. 24 is a schematic representation of the stamp of FIG. 22, contacting the resist layer, and subjected to heat and pressure, such that the resist layer softens and flows out of the way, so that the protrusions of the stamp touch, or very nearly touch, the substrate.
Figure 25:
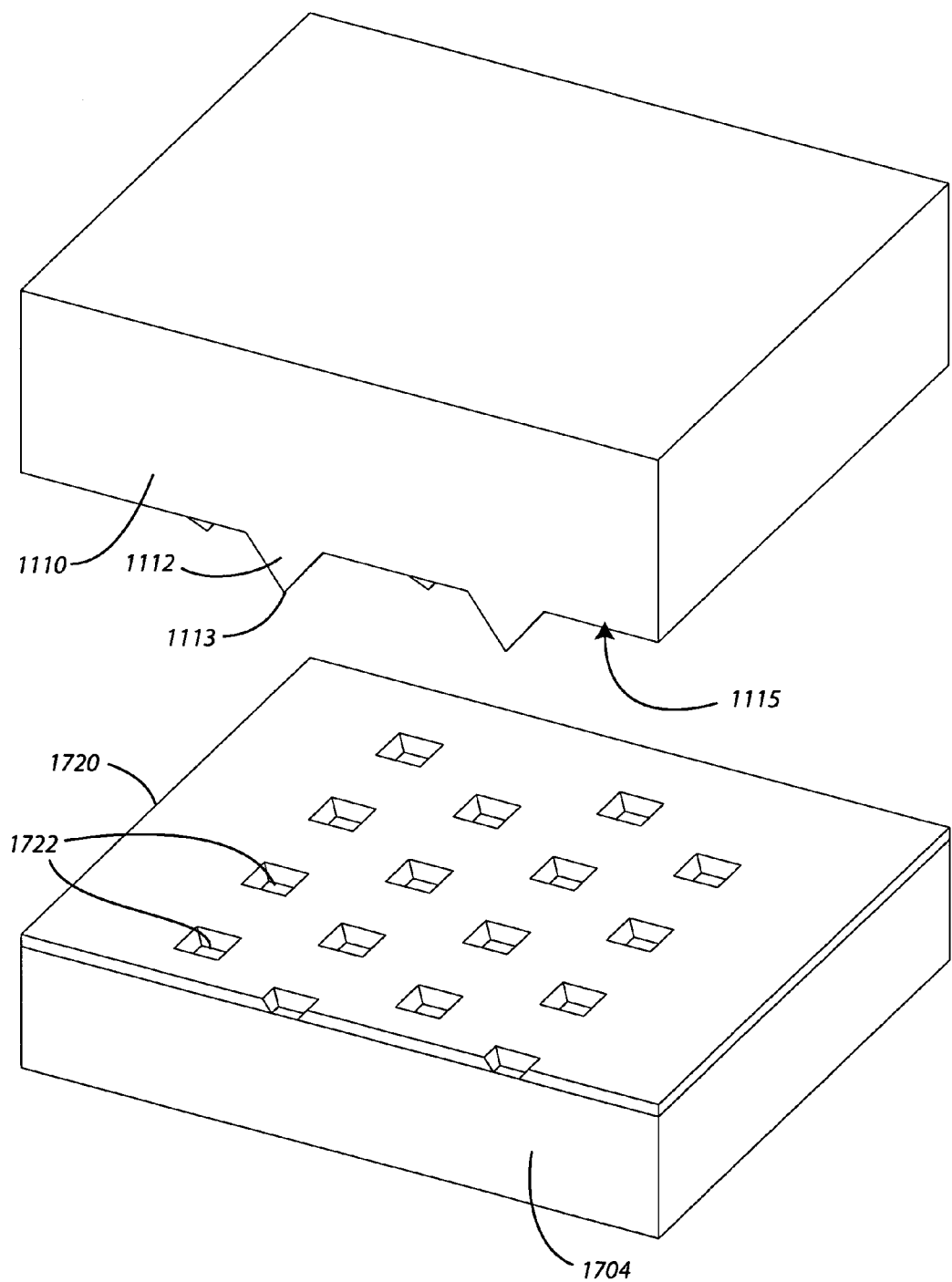
FIG. 25 is a schematic representation of the stamp of FIG. 22, after contacting the resist layer, and subjected to heat and pressure, such that the resist layer has flowed out of the way and solidified, revealing the substrate in locations that make up a specific pattern of spaced apart discrete squares.
Figure 26:
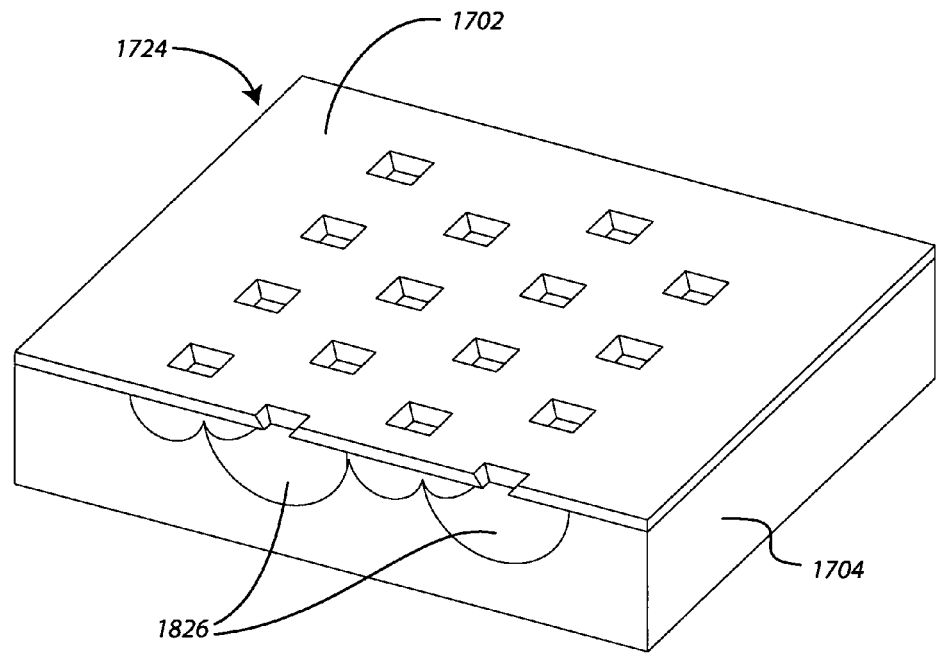
FIG. 26 is a schematic representation of the substrate shown in FIG. 25, after etchant has been provided and contacted the substrate through the patterns in the resist layer, shown in FIG. 25, with portions of the substrate having been etched away to form pits having a roughly circular perimeter which may or may not overlap, thereby forming cusps therebetween.

As shown with reference to FIGS. 17, 18 and 19, a master mold 1106 is made by first patterning rectangular, perhaps square holes 1103 in a layer 1102 of resist, covering a wafer 1104 of 1-0-0 silicon, which is etched anisotropically to form pyramidal shaped depressions 1108. The mask 1102 is removed to reveal a master mold 1106 (FIG. 19). The mold is provided with molding material, 1109 (FIG. 20), as above, which forms into a stamp 1110 having pyramidally protruding wedge elements 1112 (FIG. 21). The master mold 1106 can be reused to form additional molded stamps.

A wafer 1704 is provided (FIG. 22) coated with a film of wax 1702, as described above. The stamp 1110 is brought to bear upon the wax (FIG. 23), and pressure and heat are provided so that the wax flows away from the locations under the points 1113 of the pyramidally shaped wedges 1112 (FIG. 24), thereby exposing the silicon underneath in a pattern of rectangular openings 1722 (FIG. 25) (which are smaller in surface area than the rectangular openings 1103 in the mask used to make the master mold. The wax masked wafer of silicon is subjected to etching (FIG. 26), which results in roughly hemispherical pits 1826 being etched away. The pits may overlap, as shown, or may be spaced sufficiently apart that they do not overlap. The general effect is similar to a honey-comb. The wax mask 1702 is then removed (FIG. 27), to reveal the silicon surface, which has advantageous light trapping capacity, as described in the SAC patent. The array produced may be symmetric, or asymmetric.

The techniques described above are focused mainly on the production of extended 722 and point 1722 (FIG. 25) openings in resist films. But at least for the material system consisting of Sylgard 184 stamps, multicrystalline silicon wafers, and Stick Wax 77 resist, features of moderate width (approximately 5 to approximately 20 µm) can be formed without residue by careful control of pressure and contact time. Thus a tool with small dimension flat regions, such as flattened pyramidal tips 2912C depicted in FIG. 29C can be used successfully. Wedge shaped features (characterized by raised features with a base dimension greater than the tip dimension, and typically generally tapering from the base to the tip) are beneficial in at least two ways. First, the wedge shaped structure is stronger and more stable under load than a columnar structure. Second, the tapering form leads naturally to a systematically advancing front as the stamp engages the substrate, rather than simultaneous contact at all regions as results naturally from a flat-tipped structure. This makes the wedge imprint process less susceptible to residual areas of trapped resist material in regions to be opened. The robust performance of this patterning method with its wedge-like imprint structures contrasts with the techniques of nanoimprint lithography, in which a thin residue layer is typically present and must be removed in a subsequent step. Some key differentiators with respect to nanoimprint lithography are the wedge-shaped features, the deformability of the stamp, and the use of a truly flowable (rather than merely deformable) resist material, which enables de-wetting of the substrate by the resist. Other techniques for fabricating various tapering imprint structures are described below.

Figure 35A:
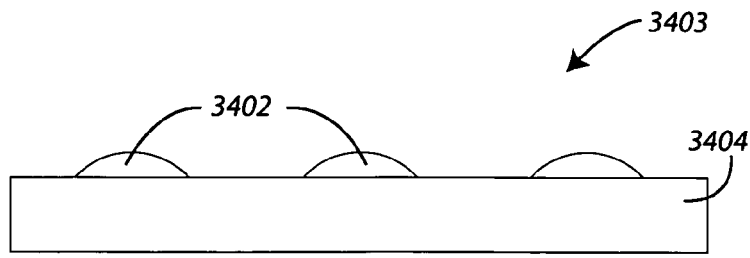
FIG. 35A is a schematic representation of the wafer of FIG. 34, viewed from an end.
Figure 35B:
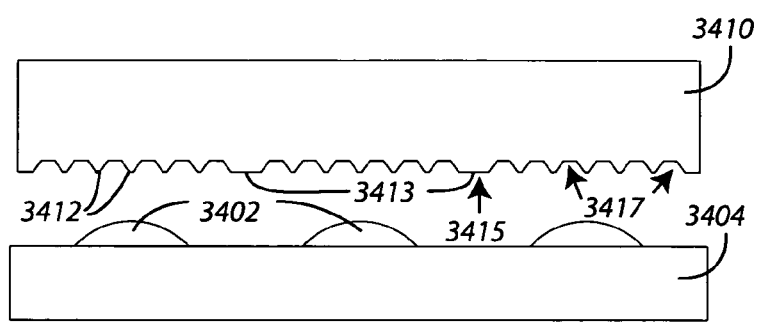
FIG. 35B is a schematic representation of the wafer shown in FIG. 35A, with a flexible stamp brought in proximity.
Figure 35C:
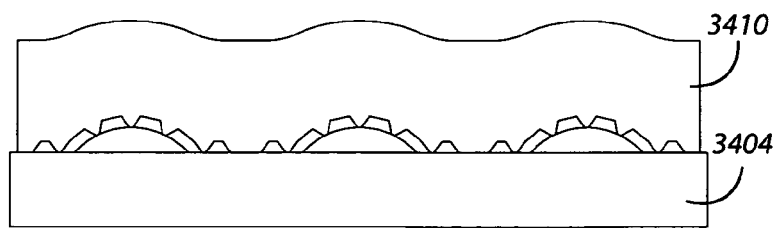
FIG. 35C is a schematic representation of the wafer shown in FIG. 35B, with the flexible stamp brought to bear upon the wafer and resist, directly contacting the wafer in some places and the resist in some other, places, the stamp in a flexed configuration.
Figure 36:
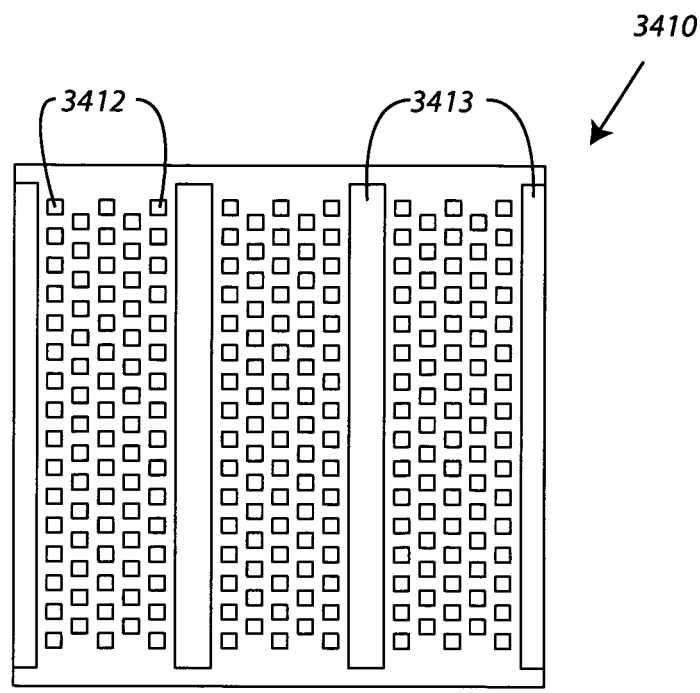
FIG. 36 is a schematic representation, in plan view, of the stamp shown in FIGS. 35B-35D.

As shown in FIGS. 35B and 36 a combination of sharp-pointed wedge features 3412 and extended features 3413 with trapezoidal cross section may be produced on a single stamp 3410 by timing the duration of the anisotropic etch process 1404 such that the flat surfaces 3415 of wide features 3413 are coplanar with the peaks of the narrower features 3412. The same result may be attained through the use of a silicon-on-insulator (SOI) wafer, a common structure in semiconductor processing that consists of a thin layer of silicon bonded to a layer of oxide which is in turn bonded to a thicker silicon substrate. The surface of the thin silicon layer is patterned and anisotropically etched, and the embedded oxide layer provides a hard stop, defining the height of the features and preventing wide features from etching deeper than narrow ones. Combinations of point features with lines of modest width are ideal for producing solar cells with light trapping etched pits interrupted by periodic etched grooves defining and confining narrow current-carrying metal fingers, which may be produced by self-aligned photovoltaic manufacturing techniques such as the SAC. Such a structure is shown in co-assigned PCT application PCT/US2009/02422, in the names of Andrew M. Gabor, Richard L. Wallace and 1366 Technologies, Inc., entitled "METHOD TO PATTERN DIFFUSION LAYERS IN SOLAR CELLS AND SOLAR CELLS MADE BY SUCH METHODS", filed under Express Mail Label No. EM355266261US on Apr. 17, 2009, the U.S. National Phase of which is application Ser. No. 12/937,829, the full disclosure of which is hereby incorporated herein by reference. Fabrication of narrow metallization fingers is another key challenge in manufacturing of high efficiency solar cells.

In some cases (such as that of the self-aligned cell with regions of patterned light trapping texture interspersed with current-carrying linear fingers), pattern fidelity in some regions (in this case the fingers) may be more critical to device performance than in others (for instance the light trapping texture). In this case as shown with reference to FIGS. 34, 35A-35E and FIG. 36, it may be advantageous to deliver the resist material 3402 to the wafer 3404 in a coarse pattern 3403 roughly aligned with the less-critical regions. The resist 3402 will then flow outward from the regions of deposition to form the desired pattern, but the stamp 3410 will protect the select critical regions preemptively, avoiding the need to dewet the substrate surface in those areas. The coarse pattern may be delivered by dispensing nozzles as shown, or alternatively by printing techniques such as screen printing, flexographic printing, gravure printing, pad printing, or stencil printing. Further, the coarse pattern may be delivered to the stamp rather than to the substrate. Any of these selective resist delivery techniques may be applied in combination with any of the disposing methods, including the platen, bladder, and roll based techniques described elsewhere herein.

Figure 35D:
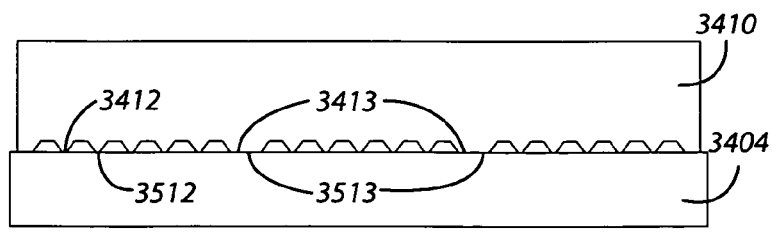
FIG. 35D is a schematic representation of the wafer shown in FIG. 35B, with the flexible stamp pressed under pressure against the wafer and resist, directly contacting the wafer in additional places, as compared to that shown in FIG. 35C, and the resist having flowed from the initial coarse pattern outward, to additional locations, the stamp being in a substantially flat configuration.
Figure 35E:
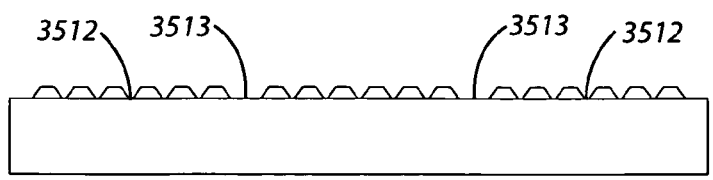
FIG. 35E is a schematic representation of the wafer shown in FIG. 35D, the stamp having been removed, and the resist having flowed to a different pattern, with finer features than the initial coarse deposit.

In an exemplary embodiment, the resist is provided in three general lines, roughly aligned between the portions of the stamp 3413 that will provide the pattern for the conducting fingers. The spaced apart, discrete elements 3412 of the stamp 3404 will correspond to light trapping pits. The stamp 3410 is disposed against the coarsely deposited mounded lines of the coarse pattern 3403 of resist 3402. Due to its flexibility, illustrated in an exaggerated manner at FIG. 35C, the stamp 3410 flexes and conforms to the irregular, non-planar surface presented by the combination of the resist mounds and the planar surface of the substrate 3404. The elongated, flat surfaces 3415 of the elongated stamp portions 3413 prevent the resist 3402, as heated, from flowing into positions adjacent the elongated portions 3413. Thus, as shown on FIG. 35E, the portions 3513 of the substrate 3404 adjacent those locations, remains resist free, and need not be dewetted of resist later in the process. At other locations, such as the locations 3512 of the substrate that correspond to the locations on the stamp 3410 of the points 3412, resist material is pushed aside, as the points 3412 come to contact the substrate 3404 surface, as shown at FIG. 35D. Thus, these regions must be dewetted of resist, which does typically occur. It may be useful to point out that the resist 3402, when heated to its flow temperature, may flow outward, through the spaces between the pointed elements 3412.

Figure 29A:
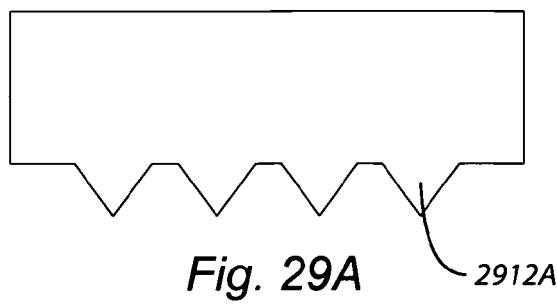
FIG. 29A is a schematic representation of an embodiment of a stamp for use herein, having pyramidal pointed protruding elements.
Figure 29B:
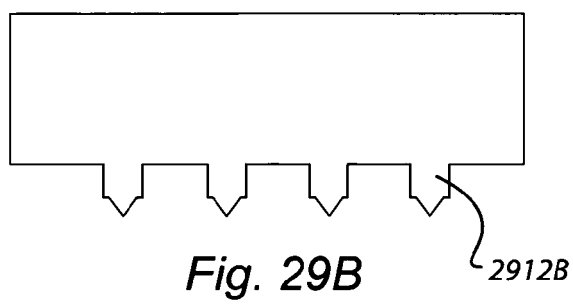
FIG. 29B is a schematic representation of an embodiment of a stamp for use herein, having prismatic protruding elements with pyramidal, pointed tips.
Figure 29C:
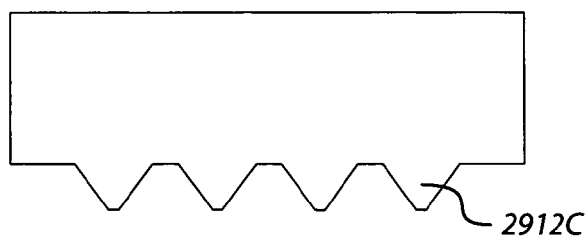
FIG. 29C is a schematic representation of an embodiment of a stamp for use herein, having pyramidal protruding elements with flat tips.

In situations where a very rough substrate is to be patterned, the wedge imprint features 2912A with 54.7 degree side wall angle as shown at FIG. 29A, may not be sufficiently compliant to ensure consistent displacement and dewetting of the areas at the tips of the features. In this case a more compliant imprint feature may be fabricated. One possible approach as shown in FIG. 29B is to create a prismatic pedestal 2912B with a wedge-shaped feature at its tip. This might be accomplished by applying and patterning a polymer layer (such as Microchem SU-8 negative photoresist) on the surface of the finished master wafer 1106 (FIG. 21) with patterned openings in the polymer resist layer corresponding in size, shape, and location to the depressions of the master, and then casting a stamp onto the resulting composite geometry. Alternatively a directional etch technique (such as Deep Reactive Ion Etching) could be used to create deep straight-walled features in the master, followed by sidewall passivation and anisotropic wet etch to form the desired pyramidal tips.

Figure 29D:
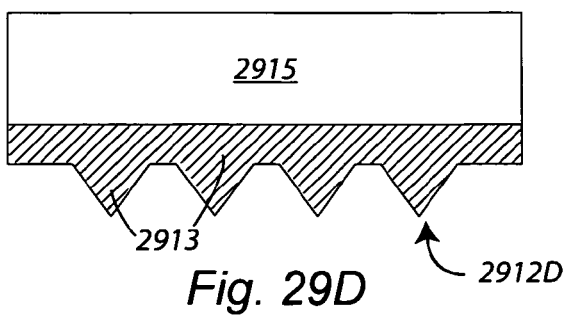
FIG. 29D is a schematic representation of an embodiment of a stamp for use herein, having prismatic protruding elements with tip portions having a different hardness from the base portion.

Another technique as shown schematically with reference to FIG. 29D for modifying stamp performance is to make the raised features 2912D out of a different elastomer 2913 than the body 2915 of the stamp. This may be accomplished by screeding a layer of one castable elastomer material over the surface of the master such that the recessed features are filled, curing the elastomer thus positioned, and subsequently casting a bulk layer of a different castable elastomer with different mechanical properties over the initial layer over the first. By this method, a stamp with relatively hard raised features 2913 and a relatively soft backer 2915 could be produced, for instance in order to pattern very small openings on a wavy, uneven substrate.

Figure 29E:
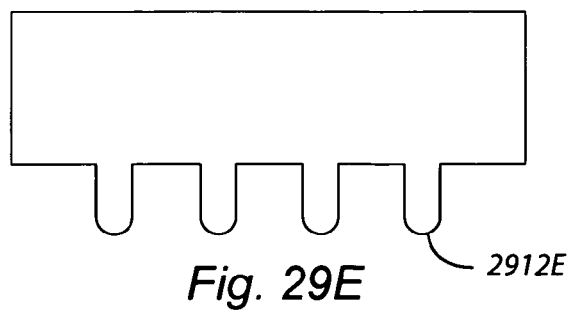
FIG. 29E is a schematic representation of an embodiment of a stamp for use herein, having prismatic protruding elements with rounded tips.

The tendency of the resist material to dewet the substrate during wedge imprint is highly dependent on the chemistry of the stamp, resist, and substrate materials. As mentioned above, for favorable materials, a more rudimentary wedge-like tool may be sufficient, and it may be desirable to have a simpler technique for creating wedge imprint tools. A tool with rounded tips 2912E (FIG. 29E) could be expected to exhibit performance intermediate between those of the pointed 2912A and planar tips (not shown), and may be fabricated by underexposure of a thick layer of positive photoresist and subsequent development. The resulting openings will not fully penetrate through the thickness of the photoresist, and the deepest parts of those openings will have rounded edges. If the photoresist is subsequently treated with release agent and used to cast an elastomeric stamp, the features will have the profile 2912E (FIG. 29E).

It is an additional benefit of some of the present techniques that the features (e.g. grooves 722 (FIG. 10)) formed in the wax resist layer 702 may be substantially smaller than the parent features (wedges 112) created in the stamp master 110 by anisotropic etching, allowing the use of relatively inexpensive low-resolution techniques to form the master 110.

The techniques described here are in no way limited to solar cell processing. Rather they have broad applicability to any substrate where rapid, inexpensive patterning at the micron scale is desired and relatively narrow features are acceptable.

The use of a resist material exhibiting thermal phase change or flowability has benefits in improving the fidelity of flexographic printing.

Figure 33:
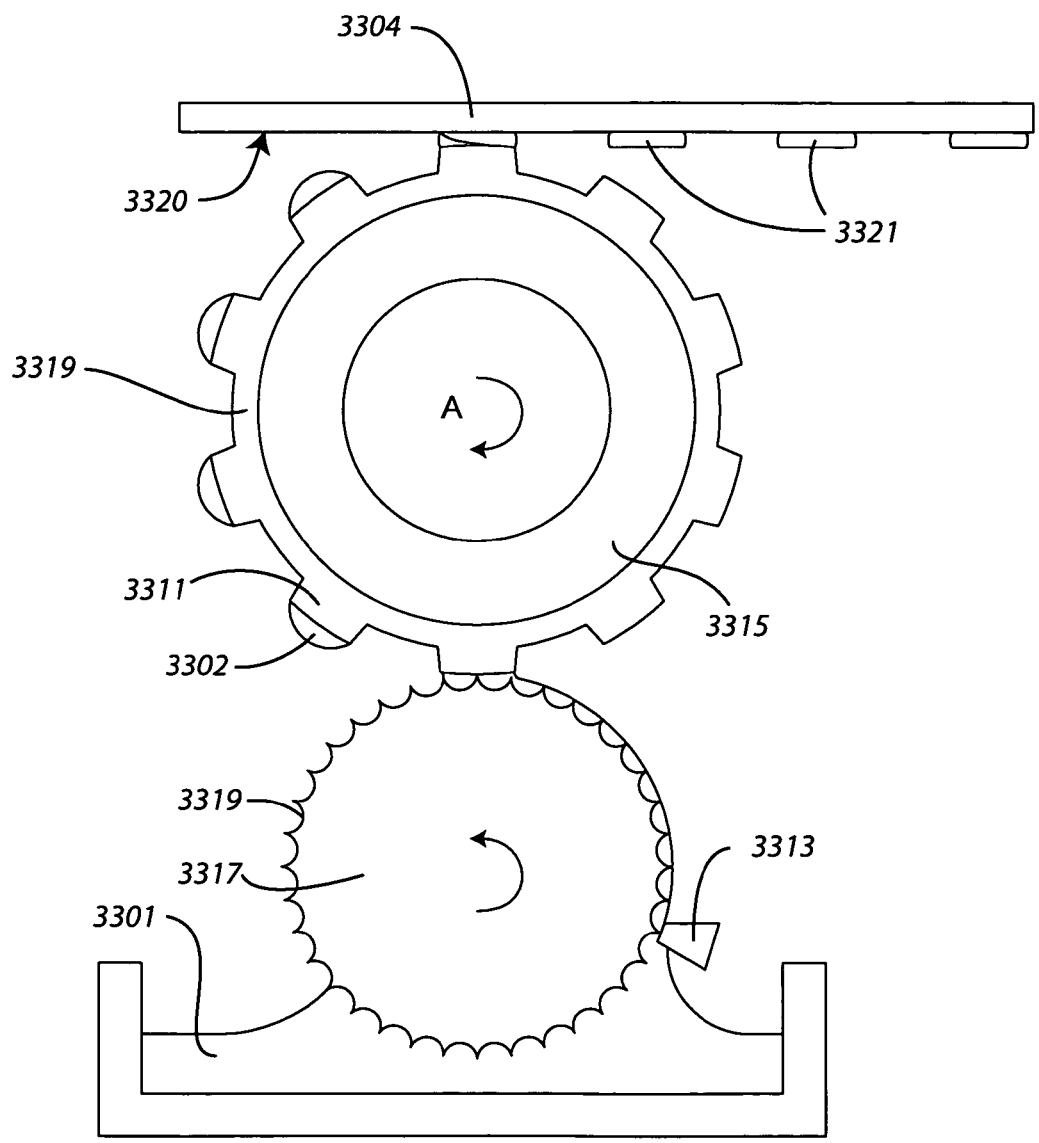
FIG. 33 is a schematic representation of an embodiment of a method hereof, using a flexible stamp mounted upon a heated roller, transferring a material that flows when heated to a substrate.

A significant limitation to use of flexographic printing for patterning at the necessary scale of approximately 5 to approximately 20 um is the squeeze-out of ink from the confined space between the raised features on the elastomeric stamp (or plate, as it is termed in the flexographic printing industry). In another aspect of a present innovation, a heat flowable resist material is transferred to a substrate by an elastomeric stamp with raised features, and the solidification of the heat flowable material limits squeeze-out, preserving the feature dimensions of the stamp. This process is shown schematically in FIG. 33. A heated anilox metering roller 3317 with microscopic pits 3319, picks up molten resist material 3301, such as wax (for instance Stick Wax 77 by Koster Keunen) from a reservoir, and a squeegee 3313 removes excess material, accurately metering the volume of resist per area. A similar type of anilox system is known in the printers' art, although it is not operated at elevated temperatures. Delivered film 3321 thickness may be in the range of approximately 1 to approximately 5 microns, or slightly under 1 micron for the finest pitch rollers. The heated anilox roller delivers resist material 3302 to the raised portions 3311 of an elastomeric stamp 3319 formed around a heated cylindrical roller 3315. Stamps known in the art are typically formed of an acrylic photoelastomer, though stamps of PDMS are possible. It may be beneficial to subject the stamps to an oxygen plasma to modify the wetting behavior.

The heated elastomeric roller 3315 delivers molten resist material 3302 from the raised portions of the stamp to the surface 3320 of the substrate 3304. Since the stamp 3311 is flexible it conforms to topographical variations in the surface 3320 of the substrate. As the resist material 3321 contacts the cold substrate 3304, the resist material 3321 begins to solidify, starting at the substrate surface 3320 and progressing toward the surface of the stamp 3311. The rate of advance of the freeze front may be readily controlled by selecting the initial temperatures of the substrate 3304 and flexographic roller 3319, appropriately.

The motion of the freeze front may be modeled by solving Fourier's equation, a technique known to those skilled in the art of transient heat transfer analysis. In an exemplary analysis, a surface speed of 15 cm/sec and an initial wafer temperature 6° C. below the melting point of the resist material resulted in a film thickness of 1 um and a freeze time of 75 microseconds. Increasing the temperature difference to 15° C. with other parameters unchanged results in a film thickness of 1.5 um. By selecting speed and temperature appropriate for the amount of resist material delivered by the anilox, the resist may be made to fill the gap between the raised area of the stamp and the substrate with the desired thickness of wax, and without ejection of wax material from the gap. The wafer 3304 then exits the roller 3315, patterned with a high-fidelity replica of the raised structures 3311 on the stamp.

It is important to note that with this embodiment, the substrate 3304 receives resist, e.g. wax, 3321 at locations that have been brought adjacent to raised portions 3311 of the stamp 3319. In contrast, in the embodiments discussed above, such as shown with reference to FIG. 30, after interaction of the stamp 3010 and the substrate 3004, the substrate 3004 is left with no resist 3002 at locations 3023, 3022 that have been brought adjacent to raised portions 3012, 3013 of the stamp 3015. Thus, the raised portions 3311 in this embodiment shown with reference to FIG. 33, function differently from the raised portions 3012, 3013 shown in FIG. 30 and other embodiments discussed above.

As mentioned above, one of the primary disadvantages of earlier displacement-based patterning techniques such as nanoimprint lithography, is the presence of a remaining film or scum layer on the substrate. The use of stiff resist materials such as PMMA requires extremely high pressures, on the order of 1900 psi, in combination with high temperatures, to displace the resist material, and still a film remains which must be removed by dry etching. The embodiments of the present innovations described above avoid this difficulty by combination of a low-viscosity heat flowable resist material and a wedge-shaped soft tool, leading to spontaneous de-wetting of the substrate by the resist material. Another embodiment avoids the scum layer by a different means, and provides the additional benefits in terms of material selection and process monitoring.

Figure 37:
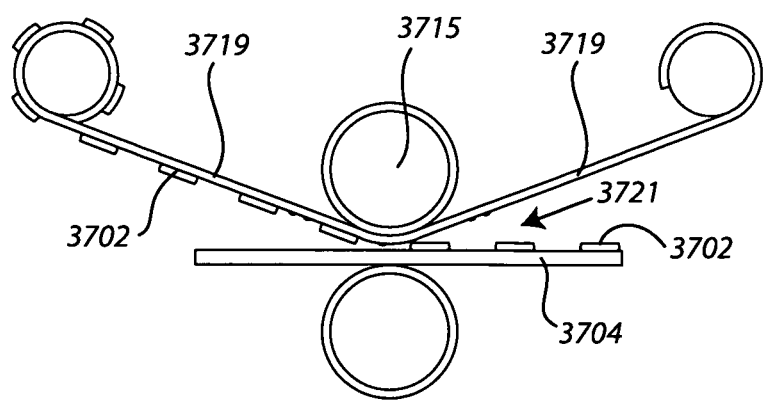
FIG. 37 is a schematic representation of an embodiment of a method invention hereof, using a continuous carrier, transferring a heat flowable material in the form of a decal, to a substrate.

In this approach, shown schematically with reference to FIG. 37 a pattern is formed as a decal 3702 on a temporary carrier 3719, and subsequently transferred to the intended substrate 3704. Decal techniques are known at larger feature scales, and are typically produced by screen printing or other relatively coarse printing techniques. In the present embodiment, the pattern is formed on the temporary carrier by a microfabrication technique, for instance by nanoimprint lithography, microtransfer molding, phase change flexography, or wedge imprinting. Formation on a temporary carrier allows the use of process parameters (for example extremely high pressures) that are not compatible with the intended multicrystalline silicon wafer substrates. The use of a flexible carrier may facilitate demolding of the decal 3702 from the pattern formation tool. The decal may be inspected optically by a machine vision system for defects before committing an expensive silicon wafer. The decal 3702 is then applied, preferably by roller 3715, to the intended substrate 3704, with a combination of heat and/or pressure, and then the carrier 3719 is withdrawn, leaving the intended resist pattern 3721 on the substrate 3704.

In an important benefit of the decal embodiment, if the adhesion between the resist and the carrier film is sufficient, any thin residue of resist material deposited on the carrier between the raised regions during the initial pattern formation will adhere to the carrier when the carrier is withdrawn, tearing away from the pattern of bulk resist which is left behind on the carrier, avoiding one of the primary problems with nanoimprint lithography. The adhesion of the resist to the substrate must be greater than that of the resist to the carrier. Carrier films with a wide variety of surface adhesion properties are commercially available. The resist material may be a wax as described above, but is preferably a polymer such as EVA, which has a gradual phase transition between solid and liquid forms, to facilitate bonding to the substrate while avoiding dimensional changes.

Similar to other techniques described above, the decal transfer technique is readily adapted to simultaneous patterning of both sides of a wafer, which is especially advantageous for light trapping.

The innovations have immediate potential for insertion into conventional multicrystalline silicon solar cell processing, allowing a ~10% increase in light capture and energy production with minimal changes to the existing processing steps. They also work well with "SAC" technologies. The SAC processes exploit textured regions separated by untextured material, which are used to define the extent of metallized and unmetallized regions by spontaneous or assisted capillary flow. The techniques also have potential more generally to other application areas where a low-cost, high-speed patterning technique would reduce costs and increase speeds, including conventional VLSI production, RFID tags and other printed electronics, display manufacturing, microwave and RF cloaking devices, and other large area patterning applications.

While particular embodiments have been shown and described, it will be understood by those skilled in the art that various changes and modifications may be made without departing from the disclosure in its broader aspects. It is intended that all matter contained in the above description and shown in the accompanying drawings shall be interpreted as illustrative and not in a limiting sense.

SUMMARY

Thus, innovations disclosed herein include methods and articles made by such method. Patterned substrates with a specified texture for photovoltaic and other uses are made. The substrates are made by impressing a flexible stamp upon a thin layer of resist material, which covers a substrate wafer. The resist changes phase or softens and flows away from the locations of impression under conditions of heat and pressure, revealing the substrate wafer. The wafer is then subjected to some shaping process, typically an etching process, with portions of the substrate exposed by action of the stamp being displaced, and portions of the substrate that are protected by the resist, remaining. A typical substrate is silicon, and a typical resist is a wax. The stamp may be used over and over again. The stamp is made by casting a flexible material into a master mold. The master mold can be reused also. The master mold may be made by providing a substrate, which also may typically be of a silicon, which is also coated with a resist layer. The resist layer is patterned with conventional means, such as photolithography, to reveal portions of the substrate. The substrate is then subjected to a shaping step, for instance anisotropic etching, which removes some portions of the substrate, to result in cavities, thereby forming the master mold.

Thus, in order of use, a master mold is prepared by masking, patterning, and shaping. The mold is used to make a flexible stamp. The stamp is used to pattern a resist layer on a workpiece, which is then subjected to a different shaping step, to shape the workpiece. The workpiece may then be used for photovoltaic, or other uses. Textures that can be provided to the workpiece include extended grooves, discrete, spaced apart pits, and combinations thereof, as well as intermediates thereof. Platen or rotary based techniques may be used for patterning the workpiece. Rough and irregular workpiece substrates may be accommodated by using extended stamp elements to insure that the shaped portion of the stamp contacts the surface of the workpiece. The stamp may be brought to bear upon the workpiece by any suitable means, such as translating a platen, which may be accomplished by mounting the platen on a flexible member that translates under the influence of a pressure differential across it.

A preferred embodiment of an invention hereof is a method of imparting a pattern to a substrate comprising the steps of: providing a substrate and a deformable stamp with patterned raised features, where the stamp has an elastic modulus of less than approximately 10 GPa; providing in at least one region of a space between the stamp and the substrate, a material that becomes flowable upon heating to a flow temperature; disposing the patterned stamp to contact at least one of the substrate or the flowable material; heating the stamp and substrate to above the flow temperature of the material; cooling the stamp and substrate assembly so that the flowable material becomes unflowable; retracting the stamp to reveal patterned material covering regions of the substrate, which pattern includes at least one open region of substrate not covered by flowable material; and subjecting the patterned substrate to at least one subsequent processing step.

With important embodiments, the material that becomes flowable may comprise a wax, or a polymer. It advantageously has a viscosity of less than about 100,000 centipoise when in a flowable state at the flow temperature, and may even have a viscosity of less than about 10,000 or even less than about 2,000 centipoise when in such state.

For a related useful embodiment, the elastic modulus of the deformable stamp is less than approximately 0.1 GPa, and may be even less than approximately 10 MPa.

The raised features may have a height of between approximately 2 and approximately 20 microns.

The deformable stamp may comprise a silicone.

It is advantageous that the deformable stamp comprise at least two portions, where a first portion has an elastic modulus substantially greater than an elastic modulus of a second portion.

The stamp may be reused to impart a pattern to another substrate.

The substrate may comprise single or multicrystalline silicon.

The substrate may have a characteristic surface roughness between approximately 0.5 and approximately 20 microns, peak-to-trough.

The step of disposing the stamp may comprise pressing upon a side of the stamp opposite the patterned raised features. It may further comprise applying pressure between approximately 100 and approximately 500 kPa, calculated on the basis of substrate area. Or, it may comprise applying a vacuum in the region between the stamp and substrate, or both pressure opposite and vacuum between.

A flexible membrane may also be used to dispose the stamp by applying differential pressure. A second substrate having a second surface to be patterned, may be provided and one may further provide a second stamp having a second patterned surface disposable against the second substrate by means of a second flexible membrane, such that both substrates can be patterned substantially simultaneously.

The substrate may be planar. In that case, the step of disposing the patterned stamp may comprise: providing a patterned stamp to rotate about an axis substantially parallel to the plane of the substrate; rotating the patterned stamp about the axis while passing the substrate adjacent the patterned stamp along a path that is substantially perpendicular to the axis of rotation, so that an interface between the stamp and the substrate forms, and providing heat proximal to the interface of the rotating stamp with the substrate, such that a portion of the interface is above the flow temperature of the flowable material, and a portion is below the flow temperature. The rotating stamp may be supported and disposed at least in part by differential pressure between two sides of the stamp. The substrate may be passed through the nip of a pair of rollers, a first of which bears the patterned stamp upon a periphery, the other forming a nip with the first. The substrate may be continuous.

Yet another important embodiment has the step of providing flowable material preceding the step of heating the stamp, which precede the step of disposing the stamp. Or, the step of heating the stamp may precedes the step of providing flowable material, which precedes the step of disposing the stamp. For another embodiment, the step of providing flowable material follows the steps of heating the stamp and disposing the stamp.

For a related group of embodiments, the patterned raised features comprise elongated structures with a cross section having a base and a tip, where the tip has a lateral dimension that is less than the lateral dimension of the base. The tip may be characterized by a sharp point. The patterned raised features may have a triangular or trapezoidal cross section. The tip may have a curvature with a radius less than the lateral dimension of the base. The raised features may have a base portion of substantially uniform lateral dimension and a tip portion, the tip portion having a region proximal the base and a region distal the base, the distal region having a lateral dimension less than the lateral dimension of the proximal region.

In yet another useful embodiment, the patterned raised features comprise features having a base, the base having a length-to-width aspect ratio in plan view less than approximately 3 to 1, and a tip, where the tip has a lateral dimension that is less than the corresponding lateral dimension of the base. The tip may be characterized by a sharp point in at least one aspect. The tip may have a curvature with a radius of less than the lateral dimension of the base.

The stamp may comprise pyramidal pointed protruding elements, with pointed, flat or rounded tips.

The raised features may comprise at least one elongated feature characterized by a length-to-width aspect ratio in plan view of at least approximately 3 to 1, and at least one concise feature characterized by a length-to-width aspect ratio in plan view of less than approximately 3 to 1. The elongated features may comprise substantially linear features, and the concise features may comprise pyramids.

The stamp may have been produced using a mold, the form of the mold having been established by anisotropic etching.

At least a portion of the raised features may be arranged in a hexagonal array, which may be symmetric or asymmetric.

The raised features may comprise pyramids.

A subsequent processing step may comprise etching.

With yet another embodiment, a subsequent processing step may comprise undercutting of substrate material from portions beneath the patterned material, such that undercut features of the substrate are larger than the corresponding at least one open region of the patterned material. The step of etching may be wet etching, isotropic etching, anisotropic etching, dry etching, reactive ion etching or deep reactive ion etching.

A particularly efficient embodiment is a method where the substrate comprises at least two surfaces facing away from each other which are patterned simultaneously.

For one group of embodiments, the step of providing a material comprises establishing a coating of material on the surface of the substrate. The coating may be between approximately 1 and approximately 10 microns thick, which may be applied by spin coating. Alternatively, the coating may be supplied by curtain coating, spray coating, gravure coating, offset gravure coating, rod coating, roll coating, blade coating, or extrusion coating.

With yet another group of embodiments, the step of providing material comprises establishing a coating of material on the surface of the stamp.

For a basic embodiment, the step of providing material comprises spraying.

The material may be provided by mixing with a volatile carrier, which carrier subsequently evaporates.

Still another group of embodiments comprises introducing a film of material in a space between the stamp and the substrate.

The material may be selectively provided in discrete regions, with at least one region not being initially provided with flowable material. The step of heating enables flow of material to at least one region not initially provided with material. The flowable material may be selectively provided by printing or dispensing material from a plurality of apertures.

Any of the embodiments mentioned above, may further comprise de-wetting of material in at least one region of the substrate that was previously wetted with material, the dewetted region corresponding to a raised feature of the stamp.

Regarding a basic embodiment, the at least one open region has a characteristic minimum lateral dimension between approximately 0.1 and approximately 2 microns. It may have a characteristic maximum lateral dimension between approximately 2 and approximately 10 microns.

The surface topography may comprise a light trapping texture, or features to define surface conductors for carrying photocurrent or both.

Many techniques and aspects of the inventions have been described herein. The person skilled in the art will understand that many of these techniques can be used with other disclosed techniques, even if they have not been specifically described in use together. For instance, any suitable method using a stamp upon a resist-covered substrate may be used, where the resist softens or changes phase, and thus flows away to reveal the substrate. The resist may be wax or other heat flowable material. The stamp can be platen based, rotary based, or another type. The shaping may be by isotropic etch, or, if appropriate, another form of etching. Rather than etching, another type of material removal may be used, exploiting the phase changing mask material, as described. Additive steps (such as "lift-off" patterned metal deposition) may also be used. The stamp may be made as described, or, by any other suitable means. Rather than being molded, it could be made by other means. It may be disposable, rather than reusable.

Resist may be applied to the workpiece substrate as a coating that is spin-coated, stamped, sprayed, or printed. Any other suitable means of providing a resist layer may be used. The resist may be pre-coated on the substrate as described, pre-coated on the stamp, or delivered directly into the space between the stamp and the substrate.

Regarding other ways of making a master mold, if the stamp is to be molded, the patterning of the resist layer can be by any suitable means. The removal of material not protected by the mask material may be by any suitable means.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A method of imparting a pattern to a substrate comprising the steps of:
    a) providing the substrate and a stamp with, elastically deformable, raised features, arranged in a pattern, each raised feature having a, tip with an un-deformed shape and an un-deformed tip width, where the stamp has an elastic modulus of less than approximately 0.1 GPa;
    b) providing, on at least one region of the substrate, an etch resist material that becomes flowable upon heating to a flow temperature;
    c) disposing the stamp raised feature tips to contact the etch resist material;
    d) pressing the raised features into the etch resist material, to a degree such that the raised features deform, elastically to have a deformed shape that is flatter than the un-deformed shape, the elastically deformed raised features having a tip width that is larger than the un-deformed tip width;
    e) heating the etch resist material to the flow temperature of the material;
    f) cooling the etch resist material so that it becomes solid;
    g) retracting the stamp to reveal patterned etch resist material covering regions of the substrate, wherein a pattern of the etch resist material includes at least one open region of the substrate not covered by the etch resist material that was previously covered with the etch resist material, said open region corresponding to a raised feature of the stamp and having a width defined by the elastically deformed tip width; and
    h) subjecting the substrate to an etching step.

2. The method of claim 1, the etch resist material comprising a wax.

3. The method of claim 1, the etch resist material having a viscosity having the order of magnitude of 100,000 centipoise at the flow temperature.

4. The method of claim 1, the raised features having a height of between approximately 2 and approximately 20 microns.

5. The method of claim 1, the deformable stamp comprising at least two portions, where a first raised portion has an elastic modulus greater than an elastic modulus of a second, backer portion.

6. The method of claim 1, the step of retracting to reveal a pattern further comprising de-wetting of the etch resist material in the at least one region of the substrate that was previously wetted with the material.

7. The method of claim 1, the substrate comprising multi-crystalline silicon.

8. The method of claim 1, the substrate having a characteristic surface roughness between approximately 0.5 and approximately 20 microns, peak-to-trough.

9. The method of claim 1, the substrate having a characteristic surface roughness that is between approximately 0.05 and approximately 1.0 times a height of the raised features.

10. The method of claim 1, the raised features comprising features having a base, the base having a length-to-width aspect ratio in plan view less than approximately 3 to 1, and a tip, where the tip has a lateral dimension that is less than the corresponding lateral dimension of the base.

11. The method of claim 10, the tip characterized by a sharp point in at least one aspect.

12. The method of claim 10, the raised features comprising features having a triangular cross section in at least one aspect.

13. The method of claim 10, the raised features having a trapezoidal cross section in at least one aspect.

14. The method of claim 1, the raised features comprising pyramidal points.

15. The method of claim 1, the raised features comprising at least one elongated feature characterized by a length-to-width aspect ratio in plan view of at least approximately 3 to 1, and at least one concise feature characterized by a length-to-width aspect ratio in plan view of less than approximately 3 to 1.

16. The method of claim 15, where the elongated feature comprises a linear feature, and the concise feature comprises a pyramid.

17. The method of claim 1, where the step of providing an etch resist material comprises establishing a coating of material on the surface of the substrate between slightly less than 1 micron and approximately 5 microns thick.

18. The method of claim 1, the at least one open region having a characteristic lateral dimension between approximately 1 and approximately 6 microns.

19. The method of claim 1, further comprising processing the substrate to form a photovoltaic cell.

20. The method of claim 19, further comprising producing a surface topography that comprises a light trapping texture.

21. The method of claim 20, further comprising producing the surface topography that comprises features to define surface conductors for carrying photocurrent.

* * * * *